(12) United States Patent
Yamazaki et al.

(10) Patent No.: US 6,998,282 B1
(45) Date of Patent: Feb. 14, 2006

(54) METHOD OF MANUFACTURING A SEMICONDUCTOR DEVICE

(75) Inventors: Shunpei Yamazaki, Tokyo (JP); Yasuyuki Arai, Kanagawa (JP); Satoshi Teramoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 09/013,960

(22) Filed: Jan. 27, 1998

Related U.S. Application Data

(63) Continuation of application No. 08/602,324, filed on Feb. 16, 1996, now Pat. No. 5,821,138.

(30) Foreign Application Priority Data

Feb. 16, 1995 (JP) .................... 7-53219

(51) Int. Cl.
*H01L 21/30* (2006.01)
*H01L 21/84* (2006.01)

(52) U.S. Cl. .................... 438/30; 438/455; 438/458; 438/459; 438/928; 438/977; 438/166

(58) Field of Classification Search ........... 438/30, 438/149, 164, 166, 406, 458, 459, 928, 977; 438/455; 148/DIG. 135; 349/45; 257/72, 257/347

See application file for complete search history.

(56) References Cited

U.S. PATENT DOCUMENTS

| | | | |
|---|---|---|---|
| 4,643,526 A | | 2/1987 | Watanabe et al. |
| 4,766,477 A | | 8/1988 | Nakagawa et al. |
| 4,838,654 A | * | 6/1989 | Hamaguchi et al. ........ 350/333 |
| 4,988,976 A | | 1/1991 | Lu |
| 5,147,826 A | | 9/1992 | Liu et al. |
| 5,206,749 A | * | 4/1993 | Zavracky et al. |
| 5,261,156 A | | 11/1993 | Mase et al. |
| 5,313,076 A | | 5/1994 | Yamazaki et al. |
| 5,315,132 A | | 5/1994 | Yamazaki |
| 5,317,236 A | | 5/1994 | Zavracky et al. |
| 5,339,180 A | | 8/1994 | Katoh |
| 5,341,012 A | | 8/1994 | Misawa et al. |
| 5,346,850 A | | 9/1994 | Kaschmitter et al. |
| 5,376,561 A | * | 12/1994 | Vu et al. |
| 5,436,744 A | | 7/1995 | Arledge et al. |

(Continued)

FOREIGN PATENT DOCUMENTS

JP        2-154232    *   6/1990

(Continued)

OTHER PUBLICATIONS

Gang Liu & S.J. Fonash, *Selective area crystallization of amorphous silicon films by low-temperature rapid thermal annealing*, Applied Physics Letter, vol. 55, No. 7, pp. 660-662, 1989.

(Continued)

*Primary Examiner*—M. Wilczewski
(74) *Attorney, Agent, or Firm*—Fish & Richardson P.C.

(57) ABSTRACT

A method of manufacturing a semiconductor device, comprises the steps of: forming a first insulating film on a first substrate; forming a second insulating film on the first insulating film; forming an amorphous silicon film on the second insulating film; holding a metal element that promotes the crystallization of silicon in contact with a surface of the amorphous silicon film; crystallizing the amorphous silicon film through a heat treatment to obtain a crystalline silicon film; forming a thin-film transistor using the crystalline silicon film; forming a sealing layer that seals the thin-film transistor; bonding a second substrate having a translucent property to the sealing layer; and removing the first insulating film to peel off the first substrate.

49 Claims, 14 Drawing Sheets

U.S. PATENT DOCUMENTS

| | | | |
|---|---|---|---|
| 5,488,012 A | * | 1/1996 | McCarthy |
| 5,529,937 A | * | 6/1996 | Zhang et al. |
| 5,543,636 A | | 8/1996 | Yamazaki |
| 5,569,610 A | | 10/1996 | Zhang et al. |
| 5,572,046 A | | 11/1996 | Takemura |
| 5,576,868 A | | 11/1996 | Togashi |
| 5,576,869 A | | 11/1996 | Yoshida |
| 5,596,023 A | | 1/1997 | Tsubota et al. |
| 5,608,232 A | | 3/1997 | Yamazaki et al. |
| 5,614,733 A | | 3/1997 | Zhang et al. |
| 5,618,739 A | * | 4/1997 | Takahashi et al. .......... 438/158 |
| 5,646,432 A | | 7/1997 | Iwaki et al. |
| 5,654,811 A | | 8/1997 | Spitzer et al. |
| 5,672,518 A | | 9/1997 | Hayashi et al. |
| 5,701,167 A | | 12/1997 | Yamazaki |
| 5,757,456 A | | 5/1998 | Yamazaki et al. |
| 5,759,878 A | | 6/1998 | Hayashi et al. |
| 5,766,977 A | | 6/1998 | Yamazaki |
| 5,781,164 A | | 7/1998 | Jacobsen et al. |
| 5,783,468 A | | 7/1998 | Zhang et al. |
| 5,786,242 A | | 7/1998 | Takemura et al. |
| 5,821,138 A | | 10/1998 | Yamazaki et al. |
| 5,834,327 A | | 11/1998 | Yamazaki et al. |
| 5,858,823 A | | 1/1999 | Yamazaki et al. |
| 5,886,366 A | | 3/1999 | Yamazaki et al. |
| 5,923,968 A | | 7/1999 | Yamazaki et al. |
| 5,962,869 A | | 10/1999 | Yamazaki et al. |
| 6,022,458 A | | 2/2000 | Ichikawa |
| 6,043,800 A | | 3/2000 | Spitzer et al. |
| 6,169,292 B1 | | 1/2001 | Yamazaki et al. |
| 6,221,701 B1 | | 4/2001 | Yamazaki |
| 6,265,745 B1 | | 7/2001 | Kusumoto et al. |
| 6,376,333 B1 | | 4/2002 | Yamazaki et al. |

FOREIGN PATENT DOCUMENTS

| | | |
|---|---|---|
| JP | 4-170520 | 6/1992 |
| JP | 4-178633 | 6/1992 |
| JP | 6-504139 | 5/1994 |
| JP | 6-244103 | 9/1994 |
| JP | 6-318701 | 11/1994 |
| JP | 8-288522 | 11/1996 |
| WO | WO 92/12453 | 7/1992 |

OTHER PUBLICATIONS

Sumiyoshi et al., "DEVICE LAYER TRANSFERRED POLY-Si TFT ARRAY FOR HIGH RESOLUTION LIQUID CRYSTAL PROJECTOR", International Electron Devices Meeting, Dec. 3-6, 1989, IEDM 89, pp. 165-168.

* cited by examiner

METHOD OF MANUFACTURING A SEMICONDUCTOR DEVICE

This is a continuation of U.S. application Ser. No. 08/602,324, filed Feb. 16, 1996, now U.S. Pat. No. 5,821,138.

BACKGROUND OF THE INVENTION

1. Field of the Invention

The present invention relates to a technique by which a display panel which is flexible (having a flexibility) is provided, and more particularly to a technique by which a flexible active matrix liquid-crystal display unit is provided.

2. Description of the Related Art

There has been known a liquid-crystal display unit as a display unit which is small-sized, light in weight and of the thin type. This has a structure in which liquid crystal is interposed between a pair of translucent substrates which are bonded to each other at intervals of several $\mu$m and held in this state as the structure of a display panel. In the operation of the display unit, an electric field is applied to liquid crystal in a predetermined region so as to change its optical characteristics, whereby the presence/absence of a light transmitted through a panel and the amount of transmitted light are controlled.

As a technique by which the display characteristics of this liquid-crystal display unit is further enhanced, there has been known the active matrix display panel. This is to arrange switching thin-film transistors (in general, an amorphous silicon thin film is used) in the respective pixels disposed in the form of a matrix, and to control charges that takes in or out of the respective pixels by the thin-film transistors.

In order to improve the characteristics of the active matrix liquid-crystal display device, it is necessary to improve the characteristics of the thin-film transistor as used. However, under the existing circumstance, it is difficult to improve such characteristics in view of the relationship of the substrate as used.

What is required for the substrate used in the liquid-crystal display panel is such an optical characteristic that the substrate transmits a visible light. Substrates having such an optical characteristic are of a variety of resin substrates, a glass substrate, a quartz substrate, etc. Of them, the resin substrate is low in a heat-resistance, and therefore it is hard to manufacture the thin-film transistor on its surface. Also, the quartz substrate can withstand a high temperature of 1000° C. or more, however, it is expensive and causes an economical problem when the display unit is enlarged. For that reason, the glass substrate is generally used.

In order to improve the characteristics of the thin-film transistor, a silicon semiconductor thin film having a crystalline property need be used for the thin-film semiconductor that forms the thin-film transistor. However, in order to form the crystalline silicon thin film, a sample must be exposed to a high-temperature atmosphere, and in the case of using the glass substrate, there arises such a problem that the substrate is warped or deformed. In particular, when making the substrate large in area, that problem becomes remarkable.

As a technique by which a liquid-crystal display panel that solves such a problem and has a high display characteristic is obtained, there has been known a technique disclosed in Japanese Patent Unexamined Publication No. Hei 6-504139. This technique is that a thin-film transistor is manufactured by using a monocrystal silicon thin film formed through the SOI technique, etc., that thin-film transistor is peeled off from the substrate for an epitaxial growth, and the thin-film transistor is bonded to an arbitrary substrate having an optical characteristic as required, to thereby obtain a panel constituting a liquid-crystal display unit.

In the case of using this technique, since the monocrystal silicon thin film formed using a known SOI technique can be used, a thin-film transistor having a high characteristic can be obtained. Also, a substrate having a curved surface can be used.

In the technique disclosed in Japanese Patent Unexamined Publication No. Hei 6-504139, a thin-film transistor is manufactured using the SOI technique. However, in the SOI technique under the existing circumstance, it is difficult to form a monocrystal thin film in a large area of 10 inch diagonal or more.

For example, under the existing circumstance, the maximum monocrystal wafer is of 16 inches in size. In this case, the maximum square panel as obtained is of $16 \times (\frac{1}{2})^{-2} \approx 11$ inch diagonal.

On the other hand, it is expected that the liquid-crystal display panel as required is of 20 or 30 inches or more in the diagonal dimension in the future. It is impossible to constitute such a large-sized liquid-crystal display panel through the method using the known SOI technique.

SUMMARY OF THE INVENTION

The present invention has been made in view of the above, and an object of the present invention is to provide a technique by which a thin-film transistor having a high characteristic over a large area is manufactured.

Another object of the present invention is to provide a technique by which a display panel is obtained using that technique.

Still another object of the present invention is to provide a thin-film transistor and a display panel which are manufactured using the above-mentioned techniques.

In order to solve the above-mentioned problems, one aspect of the present invention has been achieved by the provision of a method of manufacturing a semiconductor device, which comprising the steps of:

forming a first insulating film on a first substrate;

forming a second insulating film on the first insulating film;

forming an amorphous silicon film on said second insulating film;

holding a metal element that promotes the crystallization of silicon in contact with a surface of said amorphous silicon film;

crystallizing said amorphous silicon film through a heat treatment to obtain a crystalline silicon film;

forming a thin-film transistor using said crystalline silicon film;

forming a sealing layer that seals said thin-film transistor;

bonding a second substrate having a translucent property to said sealing layer; and removing said first insulating film to peel off said first substrate.

A specified example of the above-mentioned structure is shown in FIGS. 1 to 3. First, in FIG. 1, a first insulating film (silicon oxide film) 102 that functions as a peeling layer is formed on a glass substrate 101 which forms a first substrate. Then, a silicon oxide film 103 is formed as a second insulating film. The silicon oxide films 102 and 103 are manufactured by different methods, respectively, and the first silicon oxide film 102 is made of a material which is readily removed by etching at a poststage.

Subsequently, an amorphous silicon film 104 is formed on a second insulating film 103. Then, a solvent containing a metal element that promotes the crystallization of silicon therein is coated on the amorphous silicon film 104, to thereby form a water film 105, and a spin dry process is conducted using a spinner 106 into a state in which the metal element is brought in contact with the surface of the amorphous silicon film 104.

Thereafter, a crystal silicon film 107 is obtained by conducting a heat treatment, and the crystalline silicon film 107 is formed into an active layer 108, to thereby form a thin-film transistor as shown in FIGS. 2A and 2B. After the formation of the thin-film transistor, a layer 119 for sealing the thin-film transistor is formed. Then, a flexible translucent substrate 120 is bonded onto the layer 119. Thereafter, the silicon oxide film which is of the first insulating film 102 forming a peeling layer is removed by conducting an etching process so that the glass substrate 101 is peeled off from the thin-film transistor.

Another aspect of the present invention has been achieved by the provision of a method of manufacturing a semiconductor device, which comprises the steps of:

forming a first insulating film on a first substrate having a groove formed in a surface thereof;

forming a second insulating film on said first insulating film;

forming an amorphous silicon film on said second insulating film;

holding a metal element that promotes the crystallization of silicon in contact with a surface of said amorphous silicon film;

crystallizing said amorphous silicon film through a heat treatment to obtain a crystalline silicon film;

forming a thin-film transistor using said crystalline silicon film;

forming a sealing layer that seals said thin-film transistor;

bonding a second substrate having a translucent property to said sealing layer; and removing said first insulating film by using an etching solvent to peel off said first substrate.

Still another aspect of the present invention has been achieved by the provision of a method of manufacturing a semiconductor device, which comprises the steps of:

forming a first insulating film on a first substrate having a groove formed in a surface thereof;

forming a second insulating film on said first insulating film;

forming an amorphous silicon film on said second insulating film;

holding a metal element that promotes the crystallization of silicon in contact with a surface of said amorphous silicon film;

crystallizing said amorphous silicon film through a heat treatment to obtain a crystalline silicon film;

forming a thin-film transistor using said crystalline silicon film;

forming a sealing layer that seals said thin-film transistor;

bonding a second substrate having a translucent property to said sealing layer; and removing said first insulating film by using an etching solvent to peel off said first substrate;

wherein a gap is defined between a bottom portion of said groove and said insulating film, and said etching solvent enters said gap.

In the structures described in this specification, one kind or plural kinds of elements selected from Fe, Co, Ni, Ru, Rh, Pd, Os, Ir, Pt, Cu and Au can be used for the metal element that promotes the crystallization of silicon. In particular, Ni can obtain the higher reproducibility and effects.

Also, the metal element that promotes the crystallization of silicon is so adjusted as to provide a density of $1\times10^{14}$ to $5\times10^{18}$ atm cm$^{-3}$ in the silicon film. This is because the density of $1\times10^{14}$ atms cm$^{-3}$ is required for crystallization, and the density of more than $5\times10^{18}$ atm cm$^{-3}$ causes the semiconductor characteristic to be lowered. It should be noted that the density of atoms is defined as a minimum value of values measured by using SIMS (secondary ion mass spectroscopy) in this specification.

The crystalline silicon film obtained by using the above-mentioned metal element contains hydrogen and/or halogen at the density of 0.0005 to 5 atms % for neutralization of an unpaired coupling therein. Examples of the halogen are chlorine, fluorine and bromine.

Yet still another aspect of the present invention has been achieved by the provision of a method of manufacturing a semiconductor device, which comprises the steps of:

forming a first insulating film on a first substrate;

forming a second insulating film on said first insulating film;

forming an amorphous silicon film on said second insulating film;

holding a metal element that promotes the crystallization of silicon in contact with a surface of said amorphous silicon film;

irradiating a laser beam onto said amorphous silicon film to change a region on which the laser beam is irradiated into a monocrystal-like region or substantially monocrystal-like region;

forming a thin-film transistor by using the monocrystal-like region or substantially monocrystal-like region as an active layer;

forming a sealing layer that seals said thin-film transistor;

bonding a second substrate having a translucent property to said sealing layer; and removing said first insulating film to peel off said first substrate.

In the above-mentioned structure, the monocrystal-like region or substantially monocrystal-like region contains substantially no grain boundary therein, contains hydrogen and/or halogen atoms for compensating a defect at a density of $1\times10^{15}$ to $1\times10^{20}$ atms cm$^{-3}$ therein, also contains carbon and nitrogen atoms at a density of $1\times10^{16}$ to $5\times10^{18}$ atms cm$^{-3}$, and further contains oxygen atoms at a density of $1\times10^{17}$ to $5\times10^{19}$ atms cm$^{-3}$.

Yet still another aspect of the present invention has been achieved by the provision of a method of manufacturing a semiconductor device, comprising the steps of:

forming a first insulating film on a first substrate;

forming a second insulating film on said first insulating film;

forming an amorphous silicon film on said second insulating film;

holding a metal element that promotes the crystallization of silicon in contact with a surface of said amorphous silicon film;

irradiating a laser beam onto said amorphous silicon film to change a region on which the laser beam is irradiated into a region having a crystalline property;

forming a thin-film transistor by using the region having the crystalline property as an active layer;

forming a sealing layer that seals said thin-film transistor;

bonding a second substrate having a translucent property to said sealing layer; and removing said first insulating film to peel off said first substrate.

In a method of introducing the metal element that promotes the crystallization of silicon in accordance with the present invention described in this specification, it is simple to use a solvent containing the metal element therein. For example, in the case of using Ni, at least one kind of compound selected from nickel bromide solvent, nickel acetate solvent, nickel oxalate solvent, nickel carbonate solvent, nickel chloride solvent, nickel iodide solvent, nickel nitrate solvent, nickel sulfate solvent, nickel formate solvent, nickel acetylacenate solvent, nickel 4-cyclohexyl butyrate solvent, nickel 2-ethyl hexanoic acid solvent, nickel oxide solvent, and nickel hydroxide solvent can be used.

In the case of using Fe (iron) as the metal element, a material known as ion salt, for example, an Fe compound selected from bromide ($FeBr_2 6H_2O$), iron (II) bromide ($FeBr_3 6H_2O$), iron (II) acetate ($Fe(C_2H_3O_2)_3 \times H_2O$), iron (I) chloride ($FeCl_2 4H_2O$), iron (II) chloride ($FeCl_3 6H_2O$), iron (II) fluoride ($FeF_3 3H_2O$), iron (II) nitrate ($Fe(NO_3)9H_2O$), iron (I) phosphorate ($Fe_3(PO_4)_2 8H_2O$), and iron (II) phosphorate ($FePO_4 2H_2O$) can be used.

In the case of using Co (cobalt) as the metal element, a material known as a cobalt salt, a Co compound selected from a material known as a cobalt salt, for example, cobalt bromide ($CoBr_6H_2O$), cobalt acetate ($Co(C_2H_3O_2)_2 4H_2O$), cobalt chloride ($CoCl_2 6H_2O$), cobalt fluoride ($CoF_2 \times H_2O$), and cobalt nitrate ($Co(NO_3)_2 6H_2O$) can be used.

In the case of using Ru (ruthenium) as the metal element, as a ruthenium compound, a material known as ruthenium salt, for example, ruthenium chloride ($RuCl_3 H_2O$) can be used.

In the case of using Rh (rhodium) as the metal compound, as a rhodium compound, a material known as rhodium salt, for example, rhodium chloride ($RhCl_3 3H_2O$) can be used.

In the case of using Pd (palladium) as the metal element, as a palladium compound, a material known as palladium salt, for example, palladium chloride ($PdCl_2 2H_2O$) can be used.

In the case of using Os (osmium) as the metal element, as an osmium compound, a material known as osmium salt, for example, osmium chloride ($OsCl_3$) can be used.

In the case of using Ir (iridium) as the metal element, as an iridium compound, a material known as iridium salt, for example, a material selected from iridium trichloride ($IrCl_3 3H_2O$) and indium tetrachloride ($IrCl_4$) can be used.

In the case of using Pt (platinum) as the metal element, as a platinum compound, a material known as platinum salt, for example, platinum (II) chloride ($PtCl_4 5H_2O$) can be used.

In the case of using Cu (copper) as the metal element, as a copper compound, a material selected from copper (II) acetate ($Cu(CH_3COO)_2$), copper (II) chloride ($CuCl_2 2H_2O$) and copper (II) nitrate ($Cu(NO_3)_2 3H_2O$) can be used.

In the case of using gold as the metal element, as a gold compound, a material selected from gold trichloride ($AuCl_3 \times h_2O$) and gold nitride ($AuHCl_4 4H_2O$) can be used.

BRIEF DESCRIPTION OF THE DRAWINGS

The accompanying drawings, which are incorporated in and constitute a part of this specification, illustrate (an) embodiment(s) of the invention and, together with the description, serve to explain the objects, advantages and principles of the invention. In the drawings.

DETAILED DESCRIPTION OF THE PREFERRED EMBODIMENTS

Figure 1A:
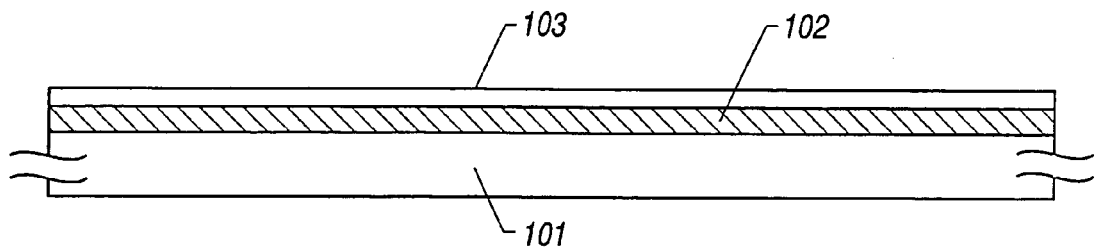
FIGS. 1A to 1D are diagrams showing a process of manufacturing a liquid-crystal panel in accordance with an embodiment of the present invention.

Now, a description will be given in more detail of embodiments in accordance with the present invention with reference to the accompanying drawings.

First Embodiment

A first embodiment relates to an example in which a liquid-crystal display thin-film integrated circuit having a large area which has been fabricated on a glass substrate at a low-temperature process of 550° C. or lower is transferred from the glass substrate onto a PET (polyethylene terephthalate) which is of a flexible substrate to constitute an active matrix liquid-crystal display unit which can be disposed even on a curved surface. More particularly, in this embodiment, the structure of a pixel region will be described. In this description, a liquid-crystal display unit is shown as one example, however, a technique described in this specification is available to the EL-type display unit.

First, a glass substrate 101 is prepared. Fine concave portions have been formed on a surface of the glass substrate 101 in advance. In this example, the concave portions are several thousands A to several $\mu$m in width and height, several to several tens $\mu$m in depth, and shaped in the form of a lattice or stripe. It is preferable to make the concave portions deep in a range in which the flatness of a peeling layer 102 formed later is maintained. A method of forming the concave portions may be achieved through an etching process using a photolithography process or a mechanical etching process.

A silicon oxide film that functions as the peeling layer 102 is formed on the glass substrate 101. In this example, the silicon oxide film using a silicon oxide base coating formation coating solution is utilized. The silicon oxide base coating formation coating solution is of silanol base monomer, oligomer, etc., being resolved in an organic solvent such as alcohol or ketone, or of fine particles of silicon oxide being dispersed in an organic solvent. As a specific example of such a silicon oxide base coating formation coating solution, OCD (ohka diffusion source) made by Tokyo Ohka Kogyo Kabushiki Kaisha can be used.

The above-mentioned OCD solution is coated on a surface to be formed by using a spinner, etc., and baked at a temperature of 200 to 300° C., thereby being capable of simply forming the silicon oxide film. Also, the silicon oxide film formed by using those silicon oxide base coating formation coating solutions (not limited to OCD) has such a characteristic that its etching rate is remarkably high (high by one figure or more depending on the conditions) in comparison with the silicon oxide film formed through the sputtering technique or the CVD technique. For example, according to an experiment conducted by this inventors, the etching rate of an oxide film (used for a gate insulating film or an interlayer insulating film) formed through the plasma CVD technique using a TEOS gas to buffer hydrofluoric acid is about 1000 to 2000 Å/min, whereas the etching rate of a silicon oxide film formed by using the above-mentioned OCD solution to buffer hydrofluoric acid is 1 μm/min or longer.

In this embodiment, the peeling layer is formed in the OCD solution made by Tokyo Ohka Kogyo Kabushiki Kaisha by using Type 2 Si 59000. The formation of the peeling layer is performed by coating the above-mentioned OCD solution by a spinner and baking at a temperature of 250° C. for 30 minutes. In this example, the peeling layer 102 which is made of the silicon oxide film is 1 μm in thickness. It should be noted that attention must be paid so that the surface of the peeling layer becomes flattened.

Figure 7:
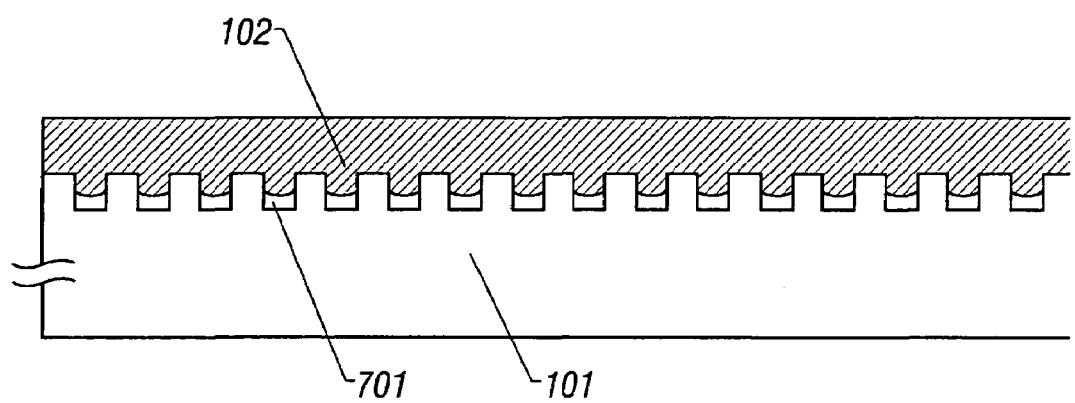
FIG. 7 is a diagram showing a state in which an oxide film is formed on a substrate having concave and convex formed on a surface thereof.

Gaps 701 are defined between the peeling layer 102 and the glass substrate 101 by the concave and convex of the glass substrate 101 as shown in FIG. 7. Also, it is effective to adjust the density of the OCD solution so as to form the gaps 701.

After the peeling layer 102 has been formed, a silicon oxide film 103 that forms an under layer is formed. The silicon oxide film 103 is formed with a fine film quality through the plasma CVD technique using the TEOS gas. Since the silicon oxide film 103 functions as a protective film that covers a back side of the thin-film transistor later, its thickness must be set to 5000 Å or more. Also, the formation of the silicon oxide film 103 that forms an under layer may be conducted through the sputtering technique (FIG. 1A).

Figure 1B:
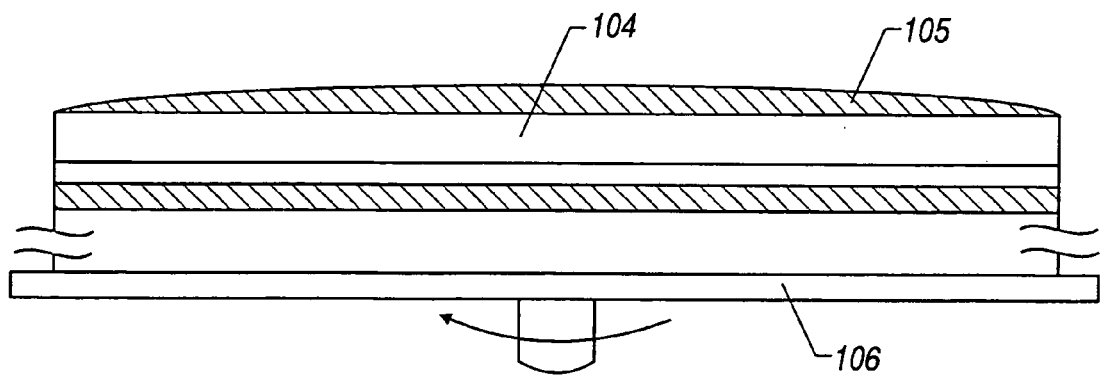

Subsequently, an amorphous silicon film 104 shown in FIG. 1B is formed through the plasma CVD technique or the decompression thermal CVD technique. The formation of the amorphous silicon film 104 may be performed by using a conventionally known film forming method. The amorphous silicon film 104 may be about 500 Å in thickness. Furthermore, a sample is disposed on a spinner 106, and a nickel acetate solution adjusted to a predetermined density is coated thereon to form a water film 105. Then, an unnecessary solution is blown off by conducting the spin dry using the spinner 106, resulting in a state where the nickel element is held in contact with the surface of the amorphous silicon film 104.

The amorphous silicon film 104 is crystallized by conducting a heat treatment in that state. The heat treatment may be conducted at a temperature of 550° C. for 4 hours. Even though the amorphous silicon film is subjected to the heat treatment at a temperature of 550° C., crystallization does not usually progress without the addition of a process for several hundreds hours or longer. However, the crystalline silicon film can be obtained even in the above-mentioned condition by using a certain metal element (in this example, nickel element) that promotes the crystallization of silicon. Also, in the case of using such a metal element, the crystalline silicon film can be obtained if heating is conducted for several tens hours even at a temperature of about 500° C. likewise. The effect of such a low-temperature crystallization can be remarkably obtained when nickel is used as a metal element. A substrate which is inexpensive and an area of which can be readily increased such as a Corning 7059 glass substrate can be used if an applied temperature is about 550° C. in a process of crystallizing the amorphous silicon film 104 through the heat treatment. Hence, a crystalline silicon film of a large area can be obtained with restraining the production costs.

Figure 1C:
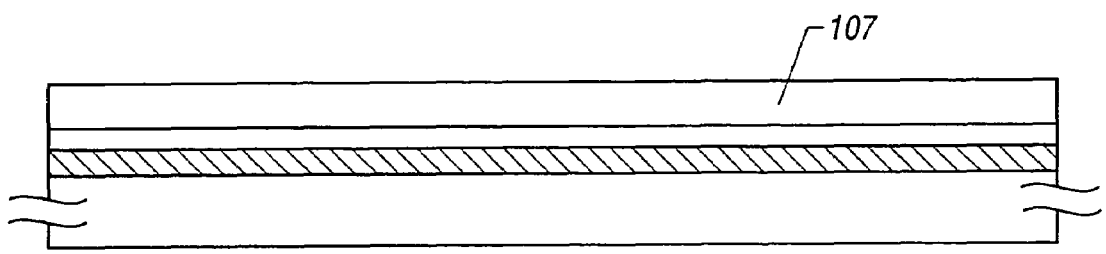
Figure 1D:
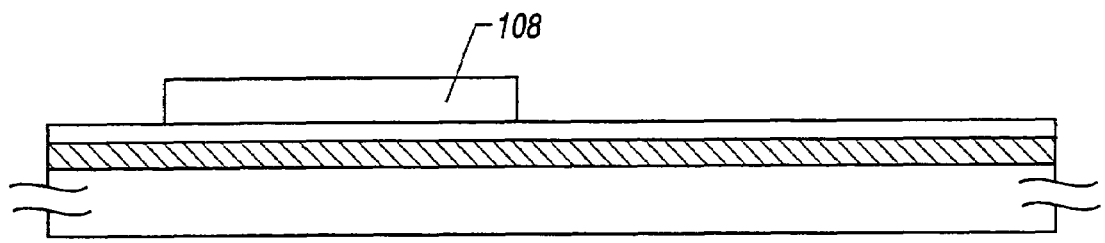

In this manner, a crystalline silicon film 107 is obtained as shown in FIG. 1C. The crystallization of the silicon film 107 is further improved by the irradiation of a laser beam. Then, the surface of the crystalline silicon film 107 is etched by about 100 Å. This is to remove the nickel layer (perhaps, being changed into nickel silicide) of a high density which exists on the surface of the crystalline silicon film 107. Then, an active layer 108 of the thin-film transistor is obtained by patterning the crystalline silicon film 107, as shown in FIG. 1D.

Figure 2A:
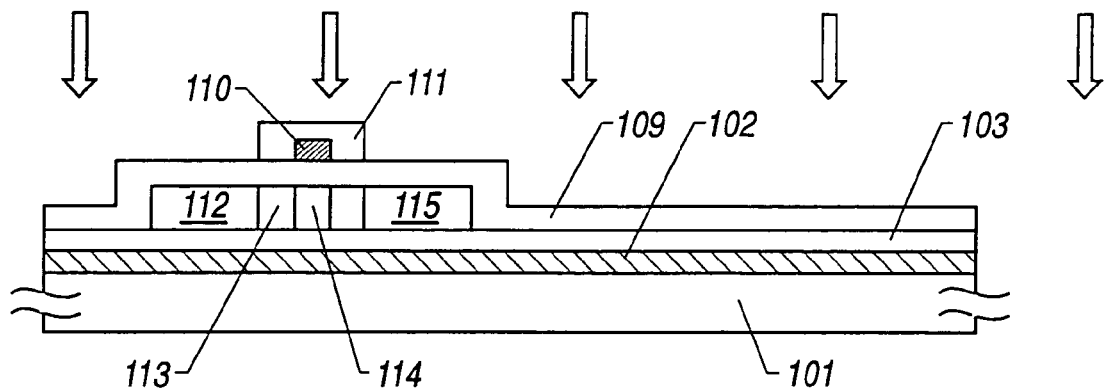
FIGS. 2A to 2C are diagrams showing a process of manufacturing a liquid-crystal panel in accordance with an embodiment of the present invention.

Subsequently, a silicon oxide film that covers the active layer 108 and functions as a gate insulating film 109 is formed as shown in FIG. 2A. The gate insulating film 109 may be set to about 1000 Å in thickness. The thickness of the gate insulating film 109, etc., are determined in accordance with a required characteristic or a utilized process.

After the gate insulating film 109 has been formed, a film that mainly contains aluminum with a small amount of scandium is formed, and patterned, to thereby obtain a gate electrode 110. The film mainly containing aluminum may be, for example, 6000 Å in thickness. In this case, the thickness of the gate electrode 110 is 6000 Å.

Furthermore, anodic oxidation is conducted with a gate electrode 110 as an anode in an electrolyte, to thereby form an anode oxide layer 111 of 2000 Å thickness. With this thickness of the anode oxide film 111, an offset gate region can be formed in a process of implanting impurity ions later.

After the formation of the anodic oxidation layer 111, impurity ions are implanted for forming the source and drain regions. In this example, in order to obtain the n-channel thin-film transistor, P (phosphorus) ions are implanted. This process may be conducted through the plasma doping technique or the ion implanting technique.

Through this process, a source region 112, drain region 115, a channel formation region 114, and an offset gate region 113 are formed in a self-matching manner. Also, after the implantation of impurity ions has been finished, a laser beam or an intense light beam is irradiated thereonto to conduct the recrystallization of the source and drain regions 112 and 115 and the activation of implanted ions. In this manner, a state shown in FIG. 2A is obtained.

After the state shown in FIG. 2A is obtained, a silicon oxide film is formed as an interlayer insulating film 116. The interlayer insulating film 116 may be made of an organic resin. The organic resin may be of an epoxy resin, an acrylate resin, a polyimide resin, etc. Also, the interlayer insulating film 116 may be of a multi-layer structure consisting of two or more layers of a variety of resin materials, or a laminated structure consisting of a silicon oxide film and a resin layer.

Figure 2B:
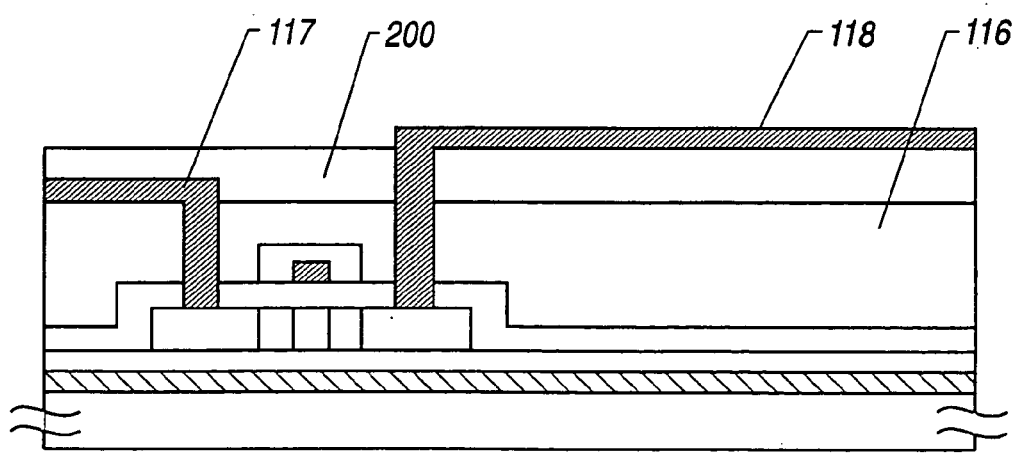

After the formation of the interlayer insulating film 116, contact holes are formed. Then, a source electrode 117 is formed using a laminated body consisting of titan and aluminum. Furthermore, a second interlayer insulating film 200 that consists of a silicon oxide film is formed thereon. Subsequently, an electrode 118 connected to a drain region is formed using ITO. This electrode 118 constitutes a pixel electrode connected to the drain region of the thin-film transistor. In this manner, the thin-film transistor including even a wire has been completed (FIG. 2B).

Figure 2C:
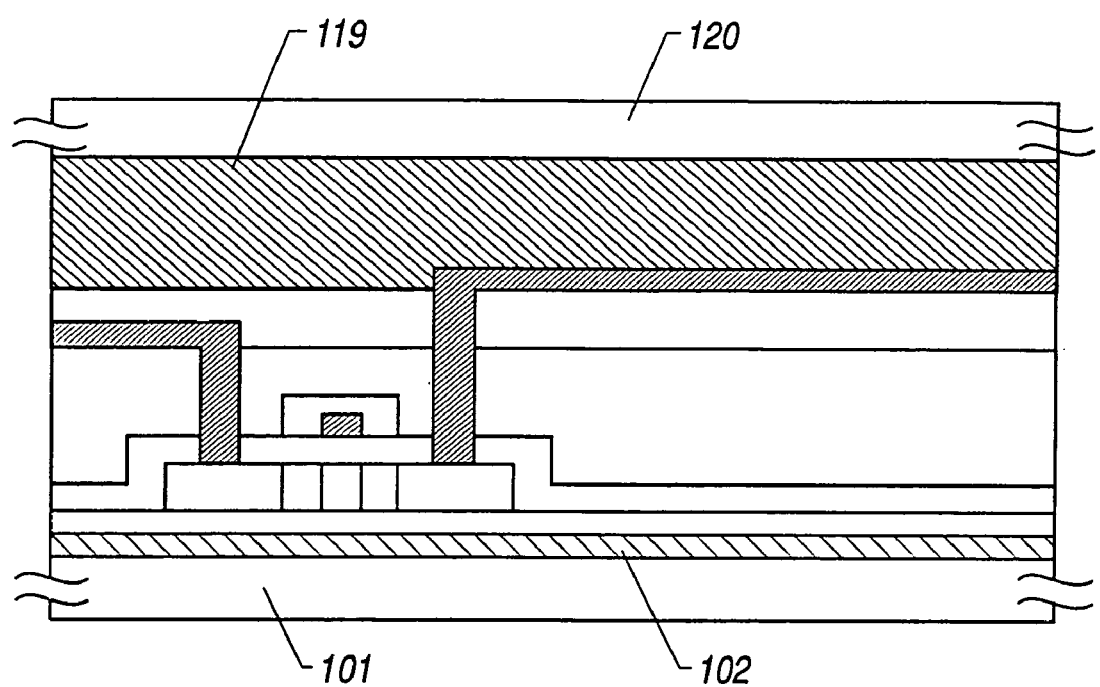

As shown in FIG. 2C, a resin material 119 that functions as a sealing material for sealing the thin-film transistor including even a wire is formed. The resin material 119 may be of an epoxy resin, an acrylate resin, a polyimide resin, etc. Also, the resin material 119 may be of a multi-layer structure consisting of two or more layers of a variety of resin materials.

In this example, the resin material 119 is of an epoxy resin that functions as an adhesive of the UV curing type. Then, a translucent and flexible resin substrate 120 that forms a liquid-crystal panel substrate is bonded with the resin material 119. In this example, the resin substrate 120 is of a PET (polyethylene terephthalate) film having a thickness of 1 mm. Also, the method of bonding the resin substrate 120 may be made by using an adhesive layer instead of the resin material 119.

Figure 3A:
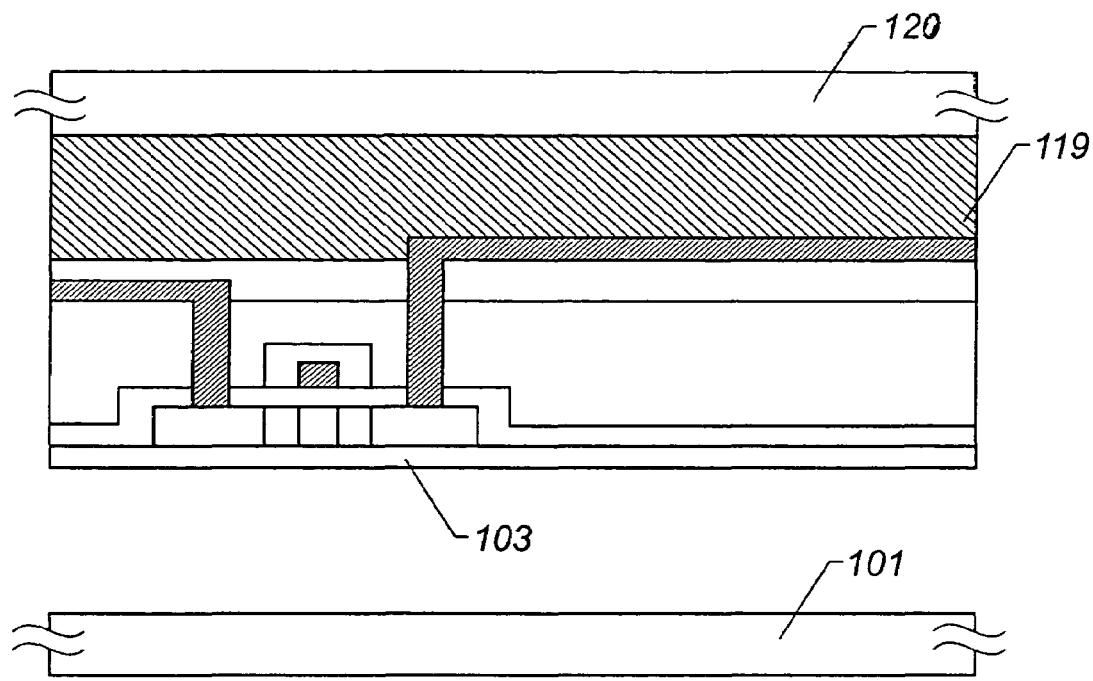
FIGS. 3A and 3B are diagrams showing a process of manufacturing a liquid-crystal panel in accordance with an embodiment of the present invention.

Then, as shown in FIG. 3A, a peeling layer is etched by using a buffer hydrofluoric acid. In this process, since grooves are defined in the surface of the glass substrate 101, gaps exist between the peeling layer 102 and the surface of the glass substrate 101 due to the existence of the grooves. Then, an etchant enters those gaps, whereby etching progresses rapidly. Furthermore, the silicon oxide film formed using a silicon oxide base coating formation coating solution which is represented by an OCD solution is higher in etching rate by one figure or more in comparison with the silicon oxide film formed through the plasma CVD technique or sputtering technique. Hence, in this etching process, only the peeling layer 102 can be selectively removed.

As a result, as shown in FIG. 3A, the glass substrate 101 and the silicon oxide film 103 that forms an under layer are peeled off from each other.

Figure 3B:
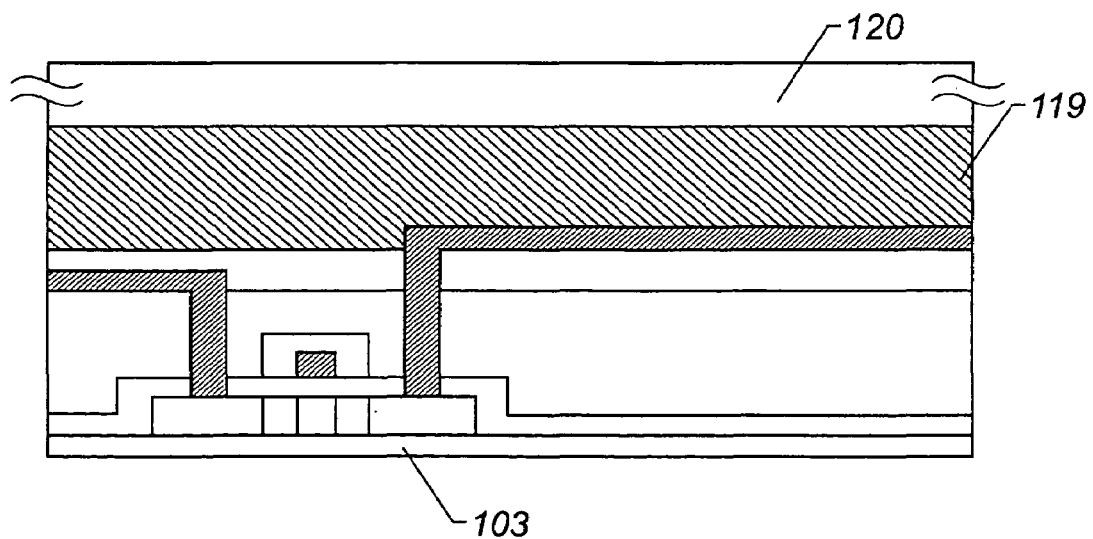

In this way, a state shown in FIG. 3B is obtained. In this state, one of the active matrix liquid-crystal display panels has been completed. In other words, one of liquid-crystal panels with a structure in which liquid crystal is interposed and held between a pair of substrates has been completed.

It should be noted that in one panel shown in FIG. 3B, only a part of one pixel in a pixel region is shown. However, the peripheral circuit thin-film transistor is constituted and the peripheral drive circuits are integrally formed with other circuits through the same process as that described above.

Figure 4:
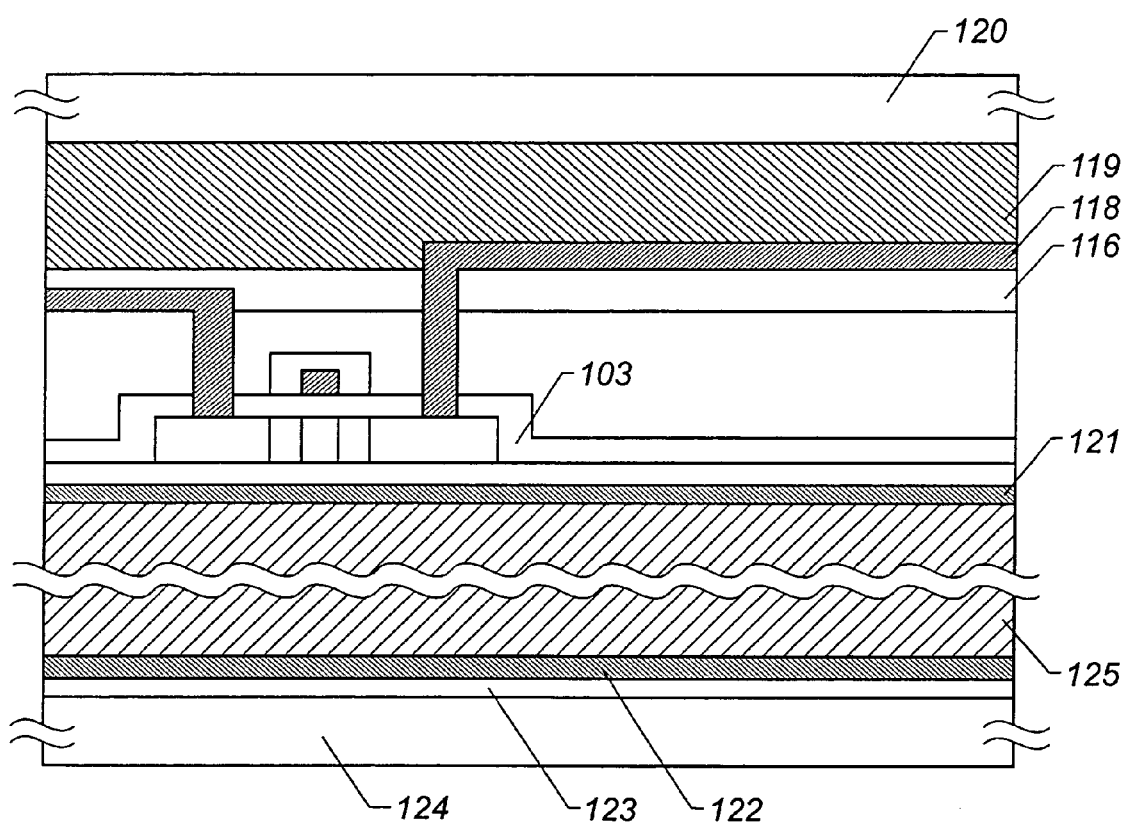
FIG. 4 is a diagram showing a liquid-crystal panel in accordance with an embodiment of the present invention.

Further, an opposing electrode 123 and an orientation film 122 are disposed on the surface of a PET film 124 having a thickness of 1 mm. Thus, a panel which is paired with the panel shown in FIG. 3B is obtained. Then, an orientation film 121 for orienting liquid crystal is formed on the silicon oxide film 103 exposed from the panel shown in FIG. 3B. Two panels are bonded to each other, and a TN-type liquid crystal is implanted in a gap (5 µm) therebetween. Thus, the liquid-crystal display panel shown in FIG. 4 is completed. Also, as not shown in the figure, a color filter, a phase compensation film, and a polarization film are disposed as occasion demands.

In this embodiment, the TN liquid crystal into which the UV curing resin material is mixed is used. After the completion of the panel, ultraviolet rays are irradiated onto the resin material to cure the resin material. As a result, an interval between a pair of panels is held by the resin material which has been cured in the form of a column. Also, since the interval between those two panels cannot be held by only that resin material when bonding those panels, it is necessary to use known spacers.

Also, in a state shown in FIG. 4, since there is a possibility that the deterioration of the characteristics progresses by entering of water, etc., the entire panel is sealed with a thermosetting resin film.

In the structure shown in FIG. 4, since a resin substrate having a flexibility as a substrate is used, the entire liquid-crystal panel can provide the flexibility. Also, because of the active matrix liquid-crystal display unit which is formed by thin-film transistors using a crystalline silicon film, it can provide a high image display function.

Second Embodiment

A second embodiment is an example in which Cu (copper) is used as a metal element that promotes the crystallization of silicon in the process described with reference to the first embodiment. In this embodiment, copper elements are introduced using copper (II) acetate ($Cu(CH_3COO)_2$) solution. The density of the copper elements in that solution is adjusted so that the density of copper elements that remain in a final silicon film is set to $1 \times 10^{16}$ to $5 \times 10^{19}$ atms $cm^{-3}$.

In the case of using Cu as the metal element that promotes the crystallization of silicon, a heat treatment for crystallization is conducted under a condition of 580° C. and 4 hours. This is because Cu is slightly small in function that promotes the crystallization of silicon in comparison with Ni. Other structures and process conditions are the same as those shown in the first embodiment.

Third Embodiment

A third embodiment shows an example in which a silicon film having a monocrystal-like region or substantially monocrystal-like region is formed on a glass substrate, and the active matrix liquid-crystal display unit having a flexible structure is constituted using this silicon film.

In this example, a Corning 7059 glass substrate (warp point 593° C.) is used as a glass substrate 501. Lattice-like or stripe-like grooves which are several µm in width and several to several tens µm in depth have been formed in advance.

First, a peeling layer 502 is formed on a glass substrate 501. The peeling layer 502 is of a silicon oxide film using the above-mentioned OCD solution. In this situation, fine gaps are formed on the bottom portion of the grooves because of the existence of the above-mentioned grooves.

Then, a silicon oxide film 503 is formed on the peeling layer 502 through the plasma CVD technique using the TEOS gas. Since the silicon oxide film 503 serves as a support that supports the thin-film transistor circuit later, it is thickened. In this example, the silicon oxide film 503 is formed to provide a thickness of 8000 Å. Further, an amorphous silicon film 504 having a thickness of 300 Å is formed through the plasma CVD technique or the decompression thermal CVD technique.

Subsequently, a sample is disposed on a spinner 506, and a nickel acetate solution is coated thereon to form a water film 505. The content density of nickel elements in the nickel acetate solution to be coated is adjusted so that the density of nickel elements that remain in the silicon film is finally $1 \times 10^{16}$ to $5 \times 10^{19}$ atms $cm^{-3}$. The density of nickel elements in the silicon film is defined by the maximum value of a silicon value using SIMS (secondary ion mass spectrometry).

After a water film 505 of the nickel acetate solution has been formed, an unnecessary solution is blown off by conducting the spin dry. In this way, the nickel element is held in contact with the surface of the amorphous silicon film 504. The amorphous silicon film 504 is crystallized by the irradiation of a laser beam in that state. In this example, a KrF excimer laser which has been beam-processed in a linear shape is used. In the irradiation of the laser beam, the sample is heated at a temperature of 550° C.

The laser beam used here is of a beam which has been processed through an optical system (which is constituted by a lot of various lenses) so as to be in a linear shape which is several tens cm in length and about 1 mm in width. The crystallization of a silicon film using the linear laser beam allows a region which has been crystallized as indicated by reference numeral 507 in FIG. 5B to grow bits by bits, by irradiation of the laser beam onto the amorphous silicon film 504 while slowly scanning the film 504 by the laser beam.

A region 507 which has been crystallized by the irradiation of the laser beam has monocrystal-like or substantially monocrystal-like electric characteristics. In other words, it has a crystal structure where no grain boundary substantially exists in that region 507. However, different from a general monocrystal wafer, hydrogen and/or halogen elements for compensating a defect, having a density of $1 \times 10^{15}$ to $1 \times 10^{20}$ atms cm$^{-3}$ is contained in that region 507. This is because the starting film is of an amorphous silicon film.

Also, the amorphous silicon film contains carbon and nitrogen atoms at a density of $1 \times 10^{16}$ to $5 \times 10^{18}$ atms cm$^{-3}$ therein. Also, it contains oxygen atoms at a density of $1 \times 10^{17}$ to $5 \times 10^{19}$ atms cm$^{-3}$. That the amorphous silicon film contains carbon, nitrogen and oxygen results from the starting film being of the amorphous silicon film 504 which has been formed through the CVD technique. In other words, this is because carbon, nitrogen and oxygen are unavoidably contained in the amorphous silicon film 504 which has been formed through the plasma CVD technique or the decompression thermal CVD technique.

Also, in the case of using the metal element that promotes the crystallization of silicon as described in this embodiment, the metal element having a density of $1 \times 10^{16}$ to $5 \times 10^{19}$ atms cm$^{-3}$ is contained therein. This density range means that the metal characteristics are exhibited in a range more than the above range, and an action for promoting the crystallization of silicon cannot be obtained in a range less than the above range.

Also, the monocrystal-like region or substantially monocrystal-like region which is obtained by the crystallization due to the irradiation of a laser beam as described in this embodiment can be obtained as a slender region 507, but its width cannot be enlarged so much. In other words, to obtain the above-mentioned region over a large area is impossible under the existing circumstance.

Figure 6:
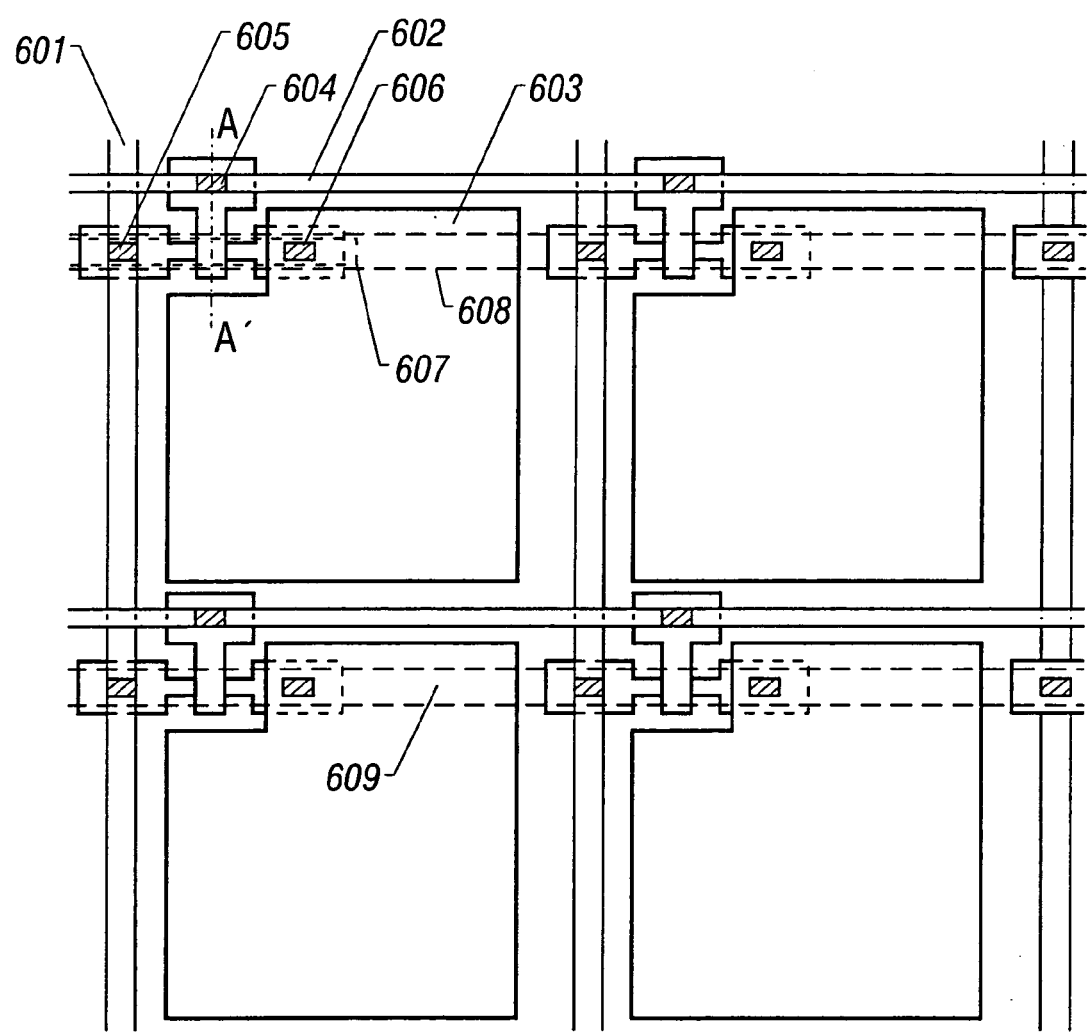
FIG. 6 is a diagram showing an outline of a pixel region of a liquid-crystal display unit.

However, in the active matrix liquid-crystal display unit, since the thin-film transistors are aligned regularly in columns as shown in FIG. 6, what is actually required for crystallization is of a specified linear region.

In FIG. 6, reference numeral 601 denotes a source line, and reference numeral 602 is a gate line. Also, reference numeral 603 is an ITO electrode that constitutes a pixel electrode. Also, reference numeral 605 denotes a contact on the source region of the thin-film transistor, 604 is a contact on the gate electrode thereof, and 606 is a contact on the drain region and the pixel electrode 603.

In the structure shown in FIG. 6, a region indicated by reference numeral 607 is of a region that constitutes an active layer of the thin-film transistor. Hence, it is sufficient to crystallize at least this region.

Actually, the structure shown in FIG. 6 is formed in the form of a matrix of several hundreds×several hundreds. Accordingly, what is required at the minimum is that the linear regions indicated by reference numerals 608 and 609 may be crystallized. Since the width of the active layer is about several to several tens μm, the linear regions indicated by reference numerals 608 and 609 can be changed into the monocrystal-like region or substantially monocrystal-like region by the irradiation of a laser beam as described in this embodiment.

Figure 5A:
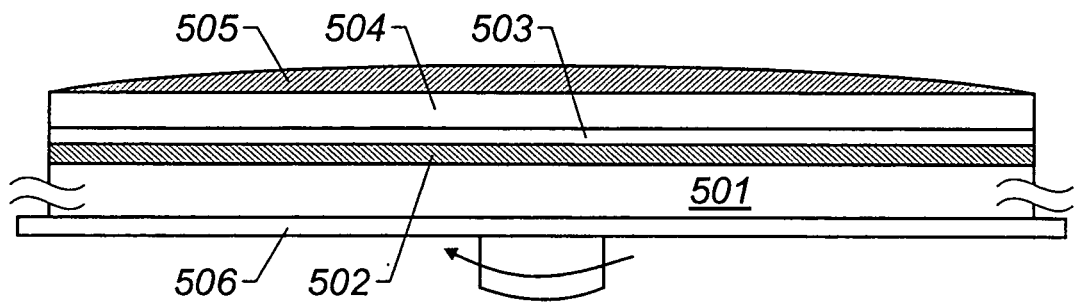
FIGS. 5A to 5D are diagrams showing a process of manufacturing a liquid-crystal panel in accordance with an embodiment of the present invention.
Figure 5B:
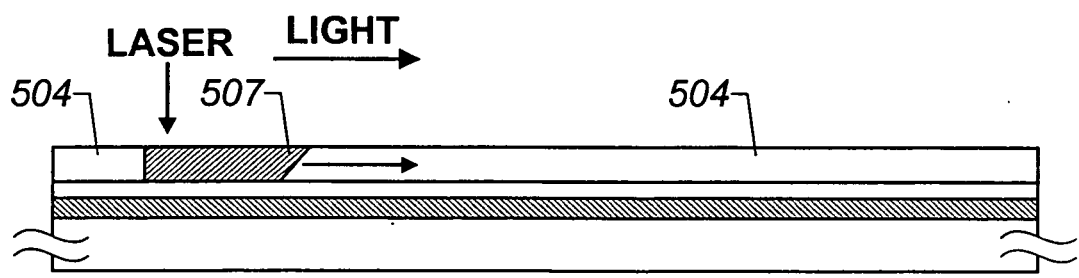

In this embodiment, the monocrystal-like region or substantially monocrystal-like region is selectively formed as indicated by reference numeral 507, by irradiating a linear laser beam in a scanning manner as shown in FIG. 5B.

In this embodiment, the metal element that promotes the crystallization of silicon is used. However, in the case of using no metal element, it is hard to form the monocrystal-like region or substantially monocrystal-like region.

Also, since the irradiation conditions of a laser beam are very fine, it is necessary that preliminary experiments are sufficiently conducted so as to find out its conditions. What is particularly important in the irradiation conditions of a laser beam is a relationship between the irradiation density of a laser beam and its scanning speed.

Even when the metal element is used, it is hard to form the monocrystal-like region or substantially monocrystal-like region without heating when the laser beam is irradiated. In this example, the heat temperature is set to 550° C., but it is preferable to increase the temperature as high as possible in a range of temperature to which the glass substrate is resistant. Specifically, it is desirable to increase the temperature as high as possible to an extent less than a warp point of the glass substrate.

The monocrystal-like region or substantially monocrystal-like region obtained by the method shown in FIG. 5B is of a linear shape having a longitudinal direction toward a depthwise of FIG. 5B. Then, the thin-film transistors to be formed are so disposed as to be aligned in a lot of numbers toward the depthwise of the figure.

Figure 5C:
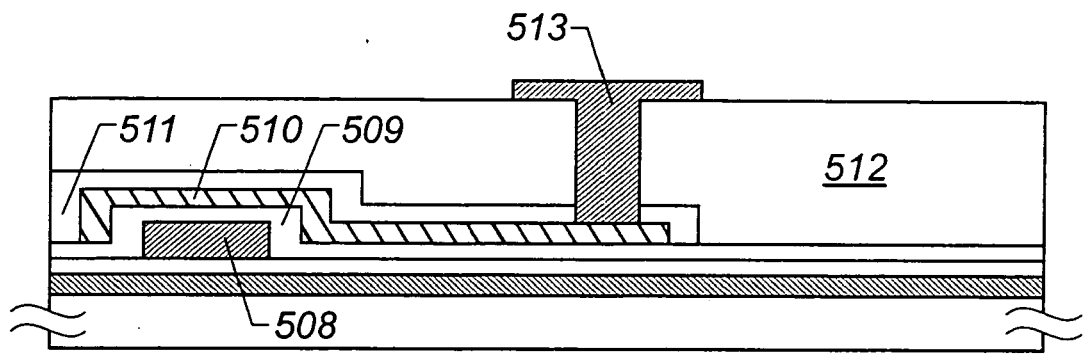

In a process of irradiating a laser beam shown in FIG. 5B, the monocrystal-like region or substantially monocrystal-like region has been formed, an active layer 508 of the thin-film transistor is formed as shown in FIG. 5C by conducting a patterning. The like active layers are formed in a lot of numbers simultaneously at a back side and a front side of the active layer 508 with respect to the paper.

The active layers 508 are formed of the monocrystal-like region or substantially monocrystal-like region. In other words, no grain boundary substantially exists in the active layer. Hence, the active layers 508 can provide electric characteristics equal to that of a transistor constituted using a monocrystal wafer or a thin-film transistor constituted using a monocrystal silicon thin film obtained through the SOI technique, etc.

After the formation of the active layers 508, a silicon oxide film 509 that functions as a gate insulating film is formed through the plasma CVD technique or the decompression thermal CVD technique. The thickness of the silicon oxide film is set to 1200 Å. Further, a gate electrode 510 that mainly contains aluminum is formed. An oxide layer 511 is formed by anodic oxidation in the periphery of that gate electrode 510.

The portion of an active layer 508 indicated by a state shown in FIG. 5C is of a portion of the channel formation region. What is shown in FIG. 5C is a cross-section of the thin-film transistor shown in FIG. 2, viewed at an angle different by 90°. The section shown in FIG. 5C corresponds to a section taken along the line A–A' of FIG. 6.

After the formation of an anodic oxide 511, an interlayer insulating film 512 is formed on the anodic oxide 511 through the plasma CVD technique using a TEOS gas. Further, after contact holes have been formed, a contact wire (contact electrode) 513 to the gate electrode 510 is formed thereon. In this situation, although not shown, required wiring are simultaneously conducted.

Then, an adhesive layer 514 made of an epoxy resin or the like, which also functions as a sealing material, is formed thereon, to thereby seal the wiring and the circuits which have been previously formed. The adhesive layer 515 is of the type which is cured by the irradiation of UV rays. Then, a translucent substrate 515 formed of a PET film is bonded onto an adhesive layer 514.

The peeling layer 502 is removed using a hydrofluoric acid base etchant (for example buffer hydrofluoric acid). In this situation, the etchant enters grooves defined in the glass substrate 501, thereby facilitating the etching of the peeling layer 502. Thus, the glass substrate 501 can be peeled off.

Figure 5D:
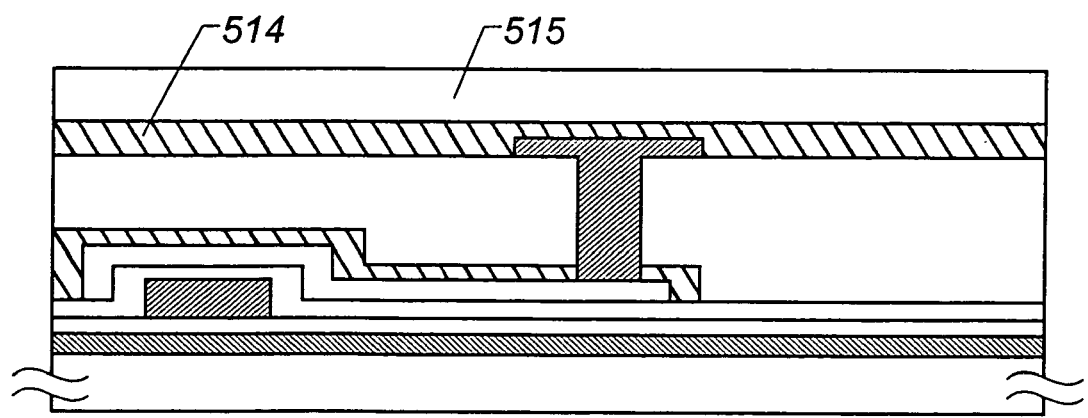

With the peeling off of the glass substrate 501, a state shown in FIG. 5D is obtained. In this way, one of panels that constitute the active matrix liquid crystal display unit is completed. Thereafter, an opposing panel is fabricated as described with reference to the first embodiment 1, and those two panels are bonded to each other at a given interval, and liquid crystal is fully inserted between the opposing panels to thereby complete the active matrix liquid-crystal panel.

In this embodiment, a process of manufacturing the liquid-crystal panel was described with reference to an example of a state in which the thin-film transistors are disposed in the pixel region as shown in FIG. 6. Accordingly, the structure of the peripheral drive circuit region (constituted by a shift register, an analog buffer circuit, etc.) for driving the thin-film transistor in the pixel region in accordance with this embodiment may be of a structure in which it is formed on the same substrate in the same process as that of the thin-film transistor that forms the pixel region (a structure in which the peripheral drive circuit and the pixel region are formed on the same substrate), or may be of a structure in which the peripheral drive circuits constituted by an IC chip is attached externally.

When the formation of the thin-film transistor that constitutes the pixel region and the formation of the thin-film transistor that constitutes the peripheral drive circuit region are conducted in the same process, the thin-film transistor that constitutes the peripheral drive circuit are simultaneously fabricated together with the fabrication of the thin-film transistor disposed in the pixel region through the same process as that shown in FIG. 5. Also, the thin-film transistors that constitute the peripheral drive circuit are aligned in one straight line and so designed that the crystallized region (a region which has been crystallized in a linear form) in accordance with the irradiation of the linear laser beam can be well used.

Fourth Embodiment

A fourth embodiment shows an example in which a quartz glass is used instead of the glass substrates shown in the first to third embodiments. When the quartz substrate is used, there arises a drawback that the material costs are expensive in comparison with a case in which the glass substrate is used. However, since a high-temperature process of 1000° C. or more can be conducted, a crystalline silicon film can be obtained even without using the metal element that promotes the crystallization of silicon.

In this embodiment, in order to restrain an increase in the costs by using the quartz substrate, the structure described below is adopted. Even when using the quartz substrate, the liquid-crystal display panel may be formed through the same process as that in the first and third embodiments. In this situation, when the peeling layer made of silicon oxide is etched, the surface of the quartz substrate is also etched with a different extent.

Accordingly, in the present invention, the quartz substrate which has been used once is flattened through the chemical etching or mechanical polishing, and grooves are again formed in the surface of the quartz substrate, whereby the quartz substrate can be used in plural numbers.

It is assumed that the thickness of the quartz substrate surface to be polished by one use is about 50 $\mu$m, and the quartz substrate having a thickness of 2 mm is used. Then, the number of times where the quartz substrate can be used until its thickness is reduced to a half is estimated to about 200 times. Under the existing circumstance, since a price of the quartz substrate with respect to the Corning 7059 glass substrate is 10 times in the case of 10 cm$^2$, the application of the structure in accordance with this embodiment can realize the same production costs as that using the glass substrate.

In the case of adopting the structure of this embodiment, the irradiation of a laser beam as shown in FIG. 3 is conducted, to form the monocrystal-like region or substantially monocrystal-like region. Further using this region, the thin-film transistor may be formed. In this case, a sample can be heated to about 1000° C., and the effect due to the irradiation of a laser beam can be enhanced. Also, as shown in the third embodiment, the effect due to irradiation of a laser beam can be enhanced using the metal element that promotes the crystallization of silicon.

Fifth Embodiment

A fifth embodiment is an example in which a glass substrate is used instead of the quartz substrate. When the glass substrate is used, since its prices is inexpensive, it can further reduce its production costs in comparison with a case of using a quartz substrate.

Sixth Embodiment

A sixth embodiment is of an example in which a heat treatment is conducted prior to the irradiation of a laser beam in the structure shown in the third embodiment. This heat treatment is conducted so as not to crystallize the amorphous silicon film to eliminate hydrogen in the film. After the hydrogen in the film has been eliminated, since hydrogen that neutralizes dangling bond (unpaired coupling) of silicon nucleus is discharged, the dangling bond (unpaired coupling) of silicon nucleus is increased in the film to lower a threshold value of an energy when crystallizing. Hence, the crystallization due to the irradiation of a laser beam can be promoted.

Also, it is effective to apply a heat treatment at a temperature lower than a warp point of glass substrate after the irradiation of a laser beam has been finished. This is because a stress in the film is relaxed through the heat treatment.

In particular, as described in the first embodiment, when making a liquid-crystal display panel finally having a flexibility, unless a stress in the active layer that constitutes the thin-film transistor is sufficiently relaxed, a crack or a defect occurs in the active layer, which adversely affects the operation of the thin-film transistor, by a stress applied externally when the liquid-crystal display panel is curved. Hence, when constituting a flexible liquid-crystal display panel, it is largely effective that a heat treatment is conducted after the irradiation of a laser beam to relax a stress in the film.

Seventh Embodiment

A seventh embodiment relates to a structure in which a silicon film has been previously crystallized through a heat treatment prior to the irradiation of a laser beam. In other words, the amorphous silicon film is crystallized by conducting a heat treatment at 550° C. for 4 hours prior to the irradiation of a laser beam, and a laser beam is further irradiated thereon as shown in FIG. 5B, to thereby partially form a monocrystal-like region or substantially monocrystal-like region.

Also, even though the monocrystal-like region or substantially monocrystal-like region cannot be formed, the crystalline property which has been crystallized by a heat treatment can be further improved by the irradiation of a laser beam.

Eighth Embodiment

An eighth embodiment is of an example in which, in the structure described in the third embodiment, a laser beam is irradiated in a state where a condition for irradiating the laser beam is out of an optimum condition for forming the monocrystal-like region or substantially monocrystal-like region. In this case, a region having the crystalline property where it is recognized that a slight grain boundary exists can be obtained. Even though such a region does not provide the electric characteristic which can be regarded as the monocrystal-like region, it has the electric characteristics sufficiently similar to those of monocrystal.

The condition which is out of the above-mentioned optimum condition is of a remarkable wide range. Accordingly, the structure shown in this embodiment is very high in practical use from the viewpoints of the fluctuation of the irradiated power of the laser beam.

Ninth Embodiment

In the present embodiment, a thin-film transistor is manufactured after gettering nickel within a silicon film which has been crystallized utilizing nickel element by using a quartz substrate as the substrate to be peeled off thereby enabling treatment to be conducted at a high temperature for a long time. Now the present embodiment will be described in the following with reference to FIG. 11.

First, by etching, grid-like or slit-like concave portions are formed on the surface of a quartz substrate 301, as shown in FIG. 7. The concave portions are sized to be several thousand Å to several μm in width and in height and several μm to several tens μm in depth.

Figure 11A:
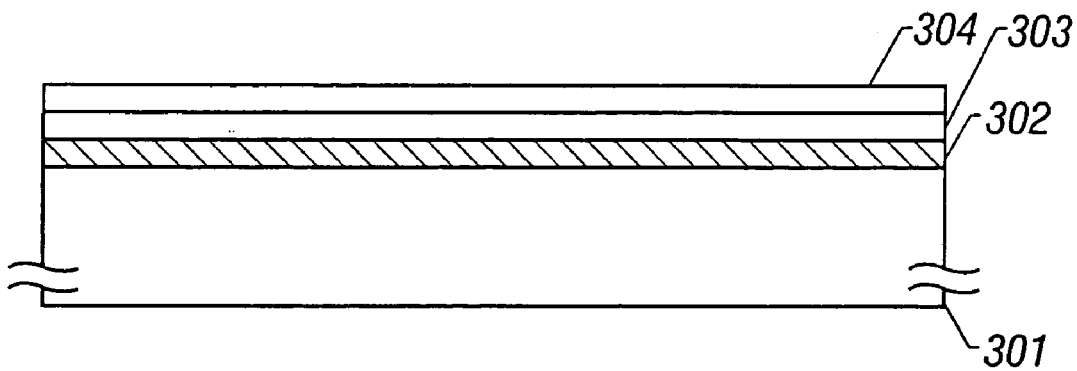
FIGS. 11(A) to 11(F) show a manufacturing process for a liquid crystal panel in accordance with an embodiment of the present invention.

Next, as shown in FIG. 11(A), similarly to Embodiment 1, OCD solution is applied to the surface of the quartz substrate 301 on which the concave portions are formed, baking is conducted, and a peel-off layer 302 which is made of a silicon oxide film and 1 μm thick is formed. A silicon oxide film as an underlying film 303 which is 5000 Å thick is formed on the surface of the peel-off layer 302 with TEOS gas as the material by plasma CVD.

It is important that the hardness of the underlying film 303 should be made as high as possible. This is because the underlying film 303 protects the rear face of the thin-film transistor to be finally obtained. The harder the underlying film 303 is (that is, the smaller its etching rate is), the higher the reliability of the thin-film transistor becomes.

It is effective that the underlying film 303 contains a small amount of halogen element represented by chlorine. By doing this, a metal element which exits in the semiconductor layer to promote the crystallization of silicon can be gettered by halogen element later in another process.

It is also effective that a hydrogen plasma treatment is additionally conducted after the underlying film 303 is formed. Also, it is effective to conduct a plasma treatment in an atmosphere of mixture of oxygen and hydrogen. This is effective in removing carbon component absorbed in the surface of the underlying film 303 to improve the interfacial characteristics between the underlying film 303 and the semiconductor film to be formed later.

Next, an amorphous silicon film 304 which is 2000 Å thick and which is to be a crystalline silicon film later is formed by low pressure thermal CVD or plasma CVD. Low pressure thermal CVD is more preferable, because the crystalline silicon film to be obtained later is more minute than that obtained by plasma CVD. Since a thermal oxide film is formed later on the surface of the amorphous silicon film 304, it is necessary to make the thickness of the amorphous silicon film 304 thicker than the thickness which is finally required.

It is desirable that the amorphous silicon film 304 which is manufactured here contains oxygen at the concentration of $1\times10^{17}$ cm$^{-3}$ to $5\times10^{19}$ cm$^{-3}$. This is because oxygen plays an important role later in the gettering process of the metal element (metal element which promotes crystallization of silicon). However, it should be noted that, in case the density of oxygen is higher than the above-mentioned density range, the crystallization of the amorphous silicon film is inhibited. Further, the density of other impurities such as nitrogen and carbon should be as low as possible. To be concrete, it is necessary that the concentration should be $2\times10^{19}$ cm$^{-3}$ or less.

Figure 11B:
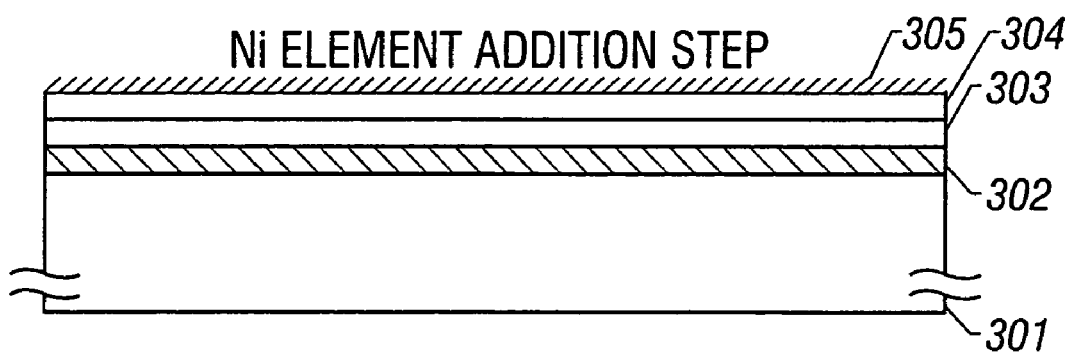

As shown in FIG. 11(B), nickel acetate solution containing nickel at a density of 10 ppm (weight-based) is applied on the surface of the amorphous silicon film 304 and dried to form a nickel layer 305. The nickel layer 305 does not always form a perfect layer, but the state is always that nickel element is in contact with the surface of the amorphous silicon film 304. The amount of nickel element to be introduced is adjusted by adjusting the density of nickel element in the solution.

Figure 11C:
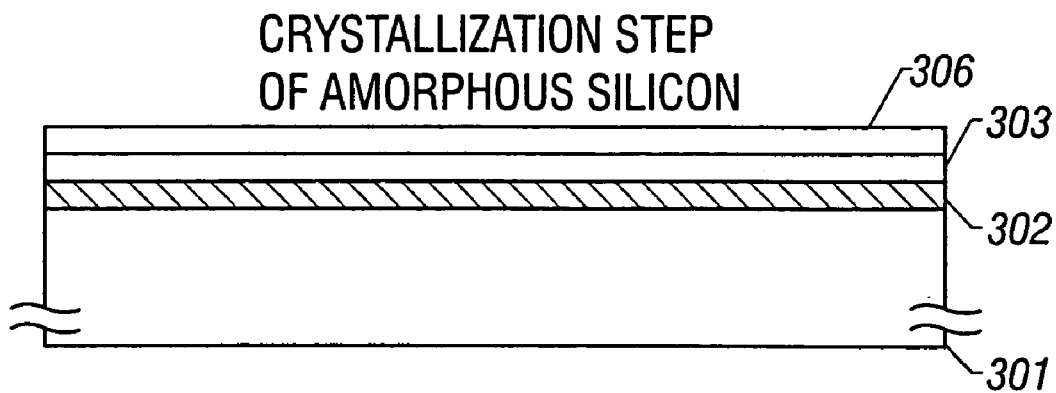

Then, a heat treatment is conducted at 900° C. for 4 hours to crystallize the amorphous silicon film 304 and to obtain a crystalline silicon film 306 shown in FIG. 11(C). In the present embodiment, since the quartz substrate 301 is used, the temperature of heating can be raised up to about 900° C., and thus, the crystalline silicon film 306 of higher crystallinity can be obtained in a shorter time compared with a case where a glass substrate is used.

Oxygen will, later in a gettering process, contribute greatly to gettering of nickel by combining with nickel. However, it has been found out that combination of oxygen and nickel in the present step of crystallization inhibits the crystallization. Consequently, in this process of crystallization by heating, it is important that forming oxide is restrained as much as possible. Therefore, it is necessary that the density of oxygen in the atmosphere where the heating process for crystallization is conducted should be on the order of ppm, preferably 1 ppm or less. Accordingly, the atmosphere of the heating treatment is nitrogen or inactive gas such as argon.

Figure 11D:
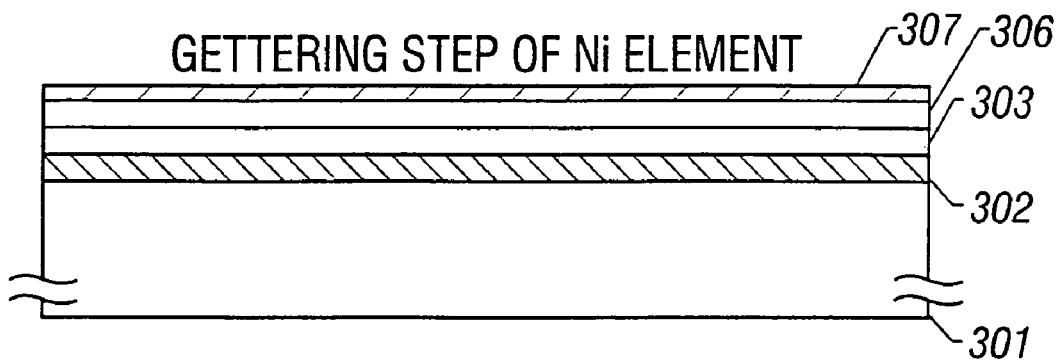

After the crystalline silicon film 306 is obtained, as shown in FIG. 11(D), a heating treatment is again conducted in an atmosphere containing halogen element to form a thermal oxide film 307. Through this process, nickel element which has been intentionally mixed at an early step for promoting crystallization is removed from within the crystalline silicon film 306.

The temperature of heating here is higher than that in the crystallization process. This is an important condition for conducting effective gettering. In the present embodiment, since the quartz substrate 301 is used, the temperature of heating is 950° C. Further, HCl is used as the gas for supplying halogen element, the atmosphere for the heat treatment is set so that the density of oxygen in the nitrogen atmosphere is 10% and the density of HCl with respect to oxygen (volume density) is 3%. Under these conditions, when the time for the treatment is 300 minutes, a thermal oxide film which is 500 Å thick containing chlorine is formed, and at the same time, by the action of chlorine (halogen element), nickel within the crystalline silicon film 306 is gettered by the thermal oxide film 307 to lower the density of nickel in the crystalline silicon film 306. The crystalline silicon film 307 is about 1700 Å thick.

A tendency is observed for the density of nickel element to be heightened around the interface between the crystalline silicon film 306 and the thermal oxide film 307. The cause is considered to be that the region where the gettering is mainly conducted is around the interface between the crystalline silicon film 306 and the thermal oxide film 307 on the side of the oxide film. The cause of the proceeding of the gettering around the interface is considered to be the existence of stress and defect around the interface.

Through this process, the density of nickel element can be lowered to be 1/10 or less at the maximum compared with that in an early step. This means that the density of nickel element can be lowered to 1/10 or less compared with a case where no gettering by halogen element is conducted. Similar effect can be obtained when other metal elements are used.

The temperature of heating in the gettering process is set so that the deformation and distortion of the substrate at the temperature are acceptable, and set 500° C. to 1100° C., preferably 700° C. to 1000° C.

For example, when the temperature of heating is 600° C. to 750° C., the time for the treatment (time for heating) is set 10 hours to 48 hours, representatively 24 hours. When the temperature of heating is 750° C. to 900° C., the time for the treatment is set 5 hours to 24 hours, representatively 12 hours. When the temperature of heating is 900° C. to 1050° C., the time for the treatment is 1 hour to 12 hours, representatively 6 hours.

The time for the treatment is appropriately set depending on the thickness of the oxide film to be obtained and the density of halogen and oxygen in the atmosphere. For example, in case a heat treatment at 950° C. is conducted in an atmosphere where oxygen of 97% and HCl of 3% are contained, in about 30 minutes, a thermal oxide film which is 500 Å thick is formed, and gettering of nickel can not be conducted enough. Consequently, it is necessary in the formation of the thermal oxide film to adjust the density of halogen and oxygen in the atmosphere in order to gain enough time for obtaining the effect of the gettering. In other words, in case the thickness of the thermal oxide film or the temperature for the formation is changed, by adjusting the density of halogen and oxygen in the atmosphere, time necessary for the gettering can be set appropriately.

Here, an example is shown where Cl is selected as the halogen element and HCl is used as the method of introducing Cl. It is preferable that HCl is mixed at a rate of 0.5% to 10% (vol %) with respect to oxygen. It should be noted that if the density of the mixed HCl is higher than the above-mentioned the surface of the film becomes rough.

Other than HCl, one kind or a plurality of kinds of gases selected from HF, HBr, $Cl_2$, $F_2$, and $Br_2$ may be used. Generally, halogen hydride may be used. The atmosphere preferably contains these gases at a density of 0.25 to 5% in case of HF, 1 to 15% in case of HBr, 0.25 to 5% in case of $Cl_2$, 0.125 to 2.5% in case of $F_2$, and 0.5 to 10% in case of $Br_2$. If the density is lower than the above-mentioned range, significant effect can not be obtained. If the density is higher than the above-mentioned range, the surface of the silicon film becomes rough.

Figure 11E:
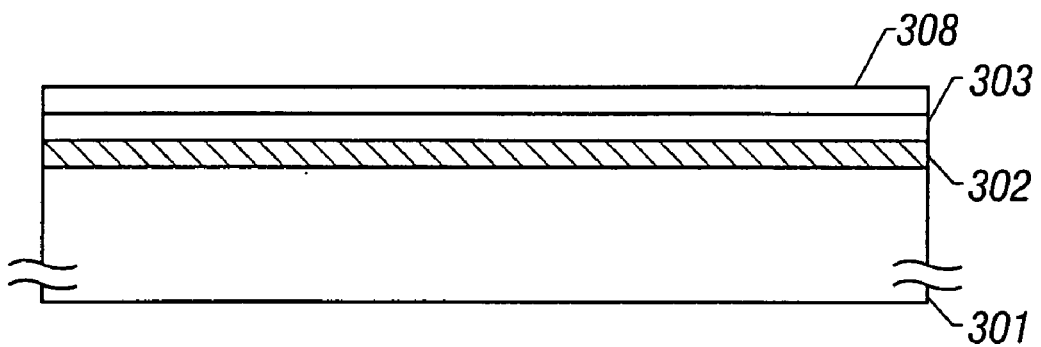

After the gettering process, as shown in FIG. 11(E), the thermal oxide film 307 containing high density of nickel is removed. The thermal oxide film 307 is removed by wet etching using buffer hydrofluoric acid (or other etchant of hydrofluoric acid system) or by dry etching. Through the etching, a crystalline silicon film 308 with the density of the contained nickel lowered can be obtained.

Since the density of the contained nickel element is relatively higher around the surface of the obtained crystalline silicon film 308, it is effective to make the etching of the oxide film 307 further proceed to overetch a little the surface of the crystalline silicon film 308.

Figure 11F:
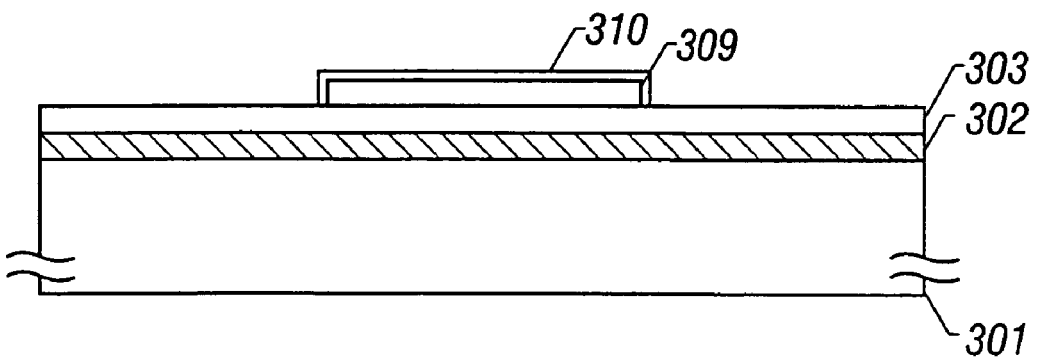

Finally, as shown in FIG. 11(F), the crystalline silicon film 308 is etched to be island-like to form an active layer 309 of the thin-film transistor. Further, a 1 thermal oxidation treatment is conducted at about 900° C. to form a thermal oxide film 310 which is several dozen A thick on the surface of the active layer 309. Then, using the active layer 309, according to the manufacturing process of a thin-film transistor of Embodiment 1 shown in FIGS. 2 and 3, a thin-film transistor is manufactured on the quartz substrate 301, the peel-off layer 301 is removed by etching, and the thin-film transistor is separated from the quartz substrate 301 to be finally located between a pair of substrates forming a liquid crystal display device.

Since the thermal oxide film 310 is the lowest layer of the gate insulating film of the thin-film transistor, the energy level of the interface between the active layer 309 and the gate insulating film may be lowered than that of the gate insulating film which is deposited by CVD on the interface with the active layer 309, thus enabling the S value of the thin-film transistor to be lowered.

As explained in Embodiment 4, since the quartz substrate 301 to be peeled off may be repeatedly used for about 200 times, employing the quartz substrate 301 does not spoil the economy. Further, since a treatment at a high temperature for a long time is possible by using the quartz substrate 301, nickel can be gettered by a thermal oxide film, and since the lowest layer of the gate insulating film can be formed of a thermal oxide film, a thin-film transistor with better characteristics can be manufactured.

Tenth Embodiment

Figure 8:
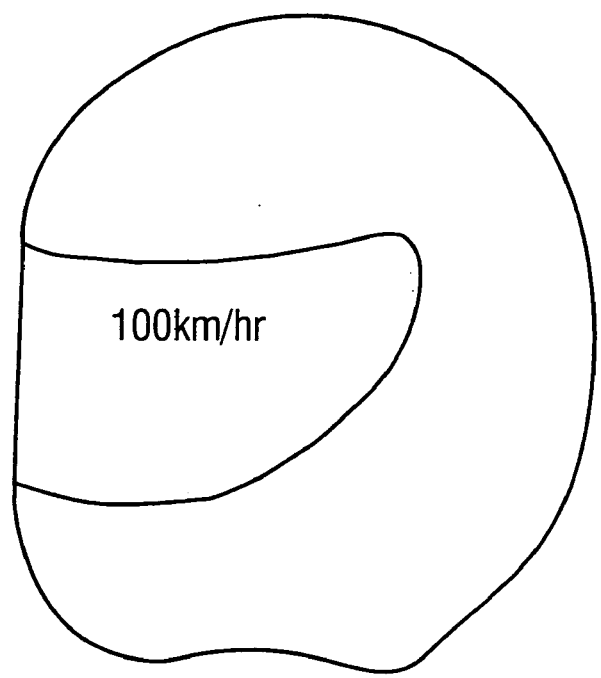
FIG. 8 is a diagram showing a state in which a liquid-crystal display unit is disposed in a helmet.

A tenth embodiment is of an applied example in which the liquid-crystal display unit obtained by the present invention described in this specification is actually used. What is shown in FIG. 8 is of an example in which the active matrix liquid-crystal display unit having a flexibility, for example, as described in the first embodiment, is disposed on a shield (usually constituted by a translucent resin material or a tempered glass) of a helmet used when riding an autobicycle.

When such a structure is applied, required information such as a speed can be displayed on the shield of the helmet. When the present invention described in this specification is used, since the liquid-crystal display unit having a flexible property can be obtained, even though, for example, the shape of the helmet is different, its attachment can be readily conducted.

Figure 9:
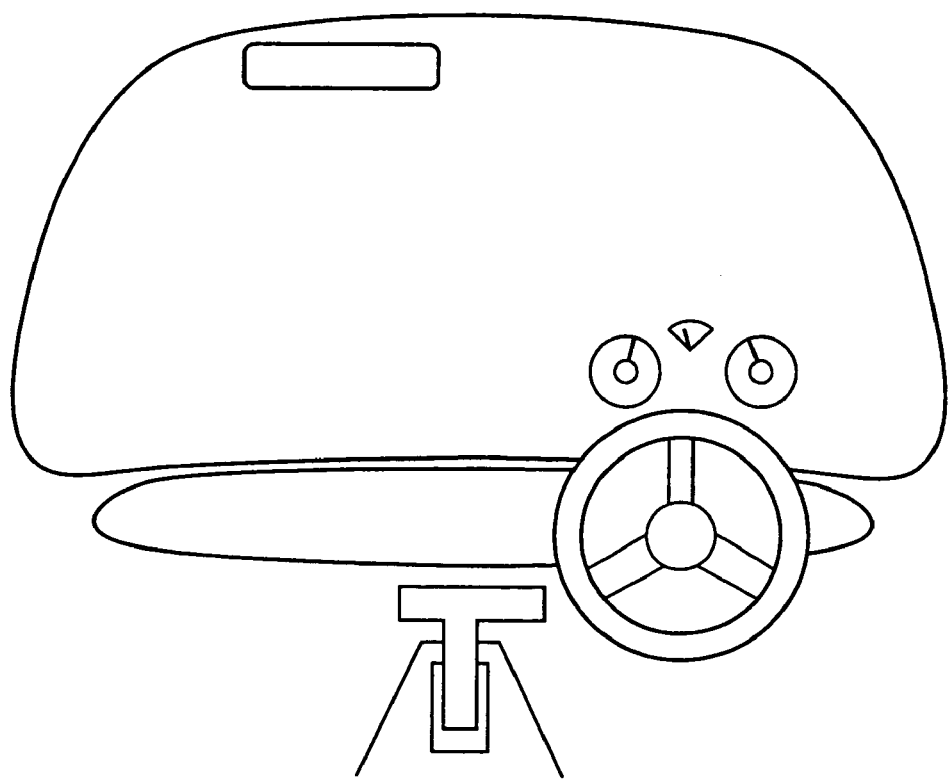
FIG. 9 is a diagram showing a state in which a liquid-crystal display unit is disposed in a front glass of a vehicle.
Figure 10:
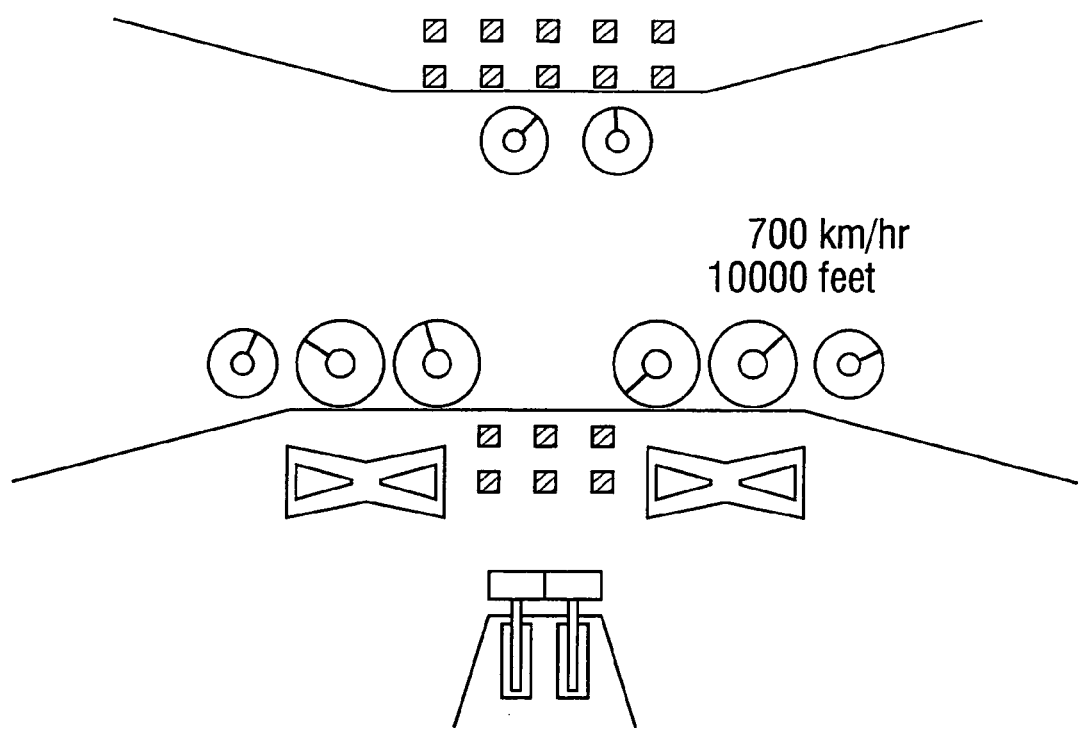
FIG. 10 is a diagram showing a state in which a liquid-crystal display unit is disposed in a front glass of a cockpit of an airplane.

Also, what is shown in FIG. 9 is of an example in which the liquid-crystal display unit having a flexible property described in this specification is attached onto a front portion of a windshield of an airplane.

As was described above, by using the present invention described in this specification, the flexible active matrix liquid-crystal display unit can be obtained. Also, since the active matrix liquid-crystal display unit can be formed with the thin-film transistor using a high-crystalline silicon thin film, an extremely high display characteristic can be obtained.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed:

1. A method of manufacturing a semiconductor device comprising:
    forming a pixel thin film transistor and a pixel electrode and a drive circuit thin film transistor for driving said pixel thin film transistor over a first substrate;
    transferring said pixel thin film transistor and said pixel electrode and said drive circuit thin film transistor together from said first substrate to a second substrate to provide said pixel thin film transistor and said pixel electrode and said drive circuit thin film transistor over said second substrate; and
    forming a layer comprising a liquid crystal in a gap to be formed between said second substrate and a third substrate with said pixel electrode between said second substrate and said third substrate,
    wherein said first substrate is removed to be separated from said pixel thin film transistor and said pixel electrode and said drive circuit thin film transistor in said transferring, and
    wherein said third substrate is a resin substrate.

2. A method according to claim 1 wherein said drive circuit thin film transistor is provided in a shift register circuit.

3. A method according to claim 1 wherein said drive circuit thin film transistor is provided in an analog buffer circuit.

4. A method according to claim 1 wherein the formation of said pixel thin film transistor and said drive circuit thin film transistor is conducted at least by forming a semiconductor film comprising silicon over said first substrate and subsequently crystallizing said semiconductor film by a linear laser light.

5. A method of manufacturing a semiconductor device comprising:
    forming a pixel thin film transistor and a pixel electrode and a drive circuit thin film transistor for driving said pixel thin film transistor over a first substrate;
    transferring said pixel thin film transistor and said pixel electrode and said drive circuit thin film transistor together from said first substrate to a second substrate comprising a resin to provide said pixel thin film transistor and said pixel electrode and said drive circuit thin film transistor over said second substrate; and
    forming a layer comprising a liquid crystal in a gap to be formed between said second substrate and a third substrate with said pixel electrode between said second substrate and said third substrate,
    wherein said first substrate is removed to be separated from said pixel thin film transistor and said pixel electrode and said drive circuit thin film transistor in said transferring, and
    wherein said third substrate is a resin substrate.

6. A method according to claim 5 wherein said drive circuit thin film transistor is provided in a shift register circuit.

7. A method according to claim 5 wherein said drive circuit thin film transistor is provided in an analog buffer circuit.

8. A method according to claim 5 wherein said resin comprises a polyethylene terephthalate.

9. A method according to claim 5 wherein the formation of said pixel thin film transistor and said drive circuit thin film transistor is conducted at least by forming a semiconductor film comprising silicon over said first substrate and subsequently crystallizing said semiconductor film by a linear laser light.

10. A method of manufacturing a semiconductor device comprising:
    forming a pixel thin film transistor and a pixel electrode and a drive circuit thin film transistor for driving said pixel thin film transistor over a first substrate comprising a quartz;
    transferring said pixel thin film transistor and said pixel electrode and said drive circuit thin film transistor together from said first substrate to a second substrate comprising a resin to provide said pixel thin film transistor and said pixel electrode and said drive circuit thin film transistor over said second substrate; and
    forming a layer comprising a liquid crystal in a gap to be formed between said second substrate and a third substrate with said pixel electrode between said second substrate and said third substrate,
    wherein said first substrate is removed to be separated from said pixel thin film transistor and said pixel electrode and said drive circuit thin film transistor in said transferring, and
    wherein said third substrate is a resin substrate.

11. A method according to claim 10 wherein said drive circuit thin film transistor is provided in a shift register circuit.

12. A method according to claim 10 wherein said drive circuit thin film transistor is provided in an analog buffer circuit.

13. A method according to claim 10 wherein said resin comprises a polyethylene terephthalate.

14. A method according to claim 10 wherein the formation of said pixel thin film transistor and said drive circuit thin film transistor is conducted at least by forming a semiconductor film comprising silicon over said first substrate and subsequently crystallizing said semiconductor film by a linear laser light.

15. A method of manufacturing a semiconductor device comprising:
forming a pixel thin film transistor and a pixel electrode and a drive circuit thin film transistor over a first substrate comprising a glass;
transferring said pixel thin film transistor and said pixel electrode and said drive circuit thin film transistor together from said first substrate to a second substrate comprising a resin to provide said pixel thin film transistor and said pixel electrode and said drive circuit thin film transistor over said second substrate; and
forming a layer comprising a liquid crystal in a gap to be formed between said second substrate and a third substrate with said pixel electrode between said second substrate and said third substrate,
wherein said first substrate is removed to be separated from said pixel thin film transistor and said pixel electrode and said drive circuit thin film transistor in said transferring, and
wherein said third substrate is a resin substrate.

16. A method according to claim 15 wherein said drive circuit thin film transistor is provided in a shift register circuit.

17. A method according to claim 15 wherein said drive circuit thin film transistor is provided in an analog buffer circuit.

18. A method according to claim 15 wherein said resin comprises a polyethylene terephthalate.

19. A method according to claim 15 wherein the formation of said pixel thin film transistor and said drive circuit thin film transistor is conducted at least by forming a semiconductor film comprising silicon over said first substrate and subsequently crystallizing said semiconductor film by a linear laser light.

20. A method of manufacturing a semiconductor device comprising:
forming a plurality of thin film transistors and a plurality of pixel electrodes over a glass substrate; and
transferring said plurality of thin film transistors and said plurality of pixel electrodes together from said glass substrate to a first substrate comprising a resin to provide said plurality of thin film transistors and said plurality of pixel electrodes over said first substrate comprising a resin; and
forming a layer comprising a liquid crystal in a gap to be formed between said first substrate and a second substrate with said plurality of pixel electrodes between said first substrate and said second substrate,
wherein said glass substrate is removed to be separated from said plurality of thin film transistors and said plurality of pixel electrodes in said transferring, and
wherein said second substrate is a resin substrate.

21. A method according to claim 20 wherein said resin comprises a polyethylene terephthalate.

22. A method according to claim 20 wherein the formation of said plurality of thin film transistors is conducted at least by forming a semiconductor film comprising silicon over said glass substrate and subsequently crystallizing said semiconductor film by a linear laser light.

23. A method of manufacturing a semiconductor device comprising:
forming an active matrix circuit comprising a pixel electrode over a quartz substrate; and
transferring said active matrix circuit from said quartz substrate to a first substrate comprising a resin to provide said active matrix circuit over said first substrate comprising a resin; and
forming a layer comprising a liquid crystal in a gap to be formed between said first substrate and a second substrate with said pixel electrode between said first substrate and said second substrate,
wherein said quartz substrate is removed to be separated from said active matrix circuit in said transferring, and
wherein said second substrate is a resin substrate.

24. A method according to claim 23 wherein said resin comprises a polyethylene terephthalate.

25. A method of manufacturing a semiconductor device comprising:
forming an active matrix circuit comprising a pixel electrode over a glass substrate; and
transferring said active matrix circuit from said glass substrate to a first substrate comprising a resin to provide said active matrix circuit over said first substrate comprising a resin; and
forming a layer comprising a liquid crystal in a gap to be formed between said first substrate and a second substrate with said pixel electrode between said first substrate and said second substrate,
wherein said glass substrate is removed to be separated from said active matrix circuit in said transferring, and
wherein said second substrate is a resin substrate.

26. A method according to claim 25 wherein said resin comprises a polyethylene terephthalate.

27. A method of manufacturing a semiconductor device comprising:
forming a plurality of pixel electrodes over a quartz substrate;
transferring said plurality of pixel electrodes together from said quartz substrate to a first substrate comprising a resin to provide said plurality of pixel electrodes over said first substrate; and
forming a layer comprising a liquid crystal in a gap to be formed between said first substrate and a second substrate with said plurality of pixel electrodes between said first substrate and said second substrate,
wherein said quartz substrate is removed to be separated from said plurality of pixel electrodes in said transferring, and
wherein said second substrate is a resin substrate.

28. A method according to claim 27 wherein said resin of said first substrate comprises a polyethylene terephthalate.

29. A method according to claim 27 wherein said resin of said second substrate comprises a polyethylene terephthalate.

30. A method of manufacturing a semiconductor device comprising:
forming a plurality of pixel electrodes over a glass substrate;
transferring said plurality of pixel electrodes together from said glass substrate to a first substrate comprising a resin to provide said plurality of pixel electrodes over said first substrate; and
forming a layer comprising a liquid crystal in a gap to be formed between said first substrate and a second substrate with said plurality of pixel electrodes between said first substrate and said second substrate, wherein said glass substrate is removed to be separated from said plurality of pixel electrodes in said transferring, and wherein said second substrate is a resin substrate.

31. A method according to claim 30 wherein said resin of said first substrate comprises a polyethylene terephthalate.

32. A method according to claim 30 wherein said resin of said second substrate comprises a polyethylene terephthalate.

33. A method of manufacturing a semiconductor device comprising:

forming an active matrix circuit over a quartz substrate;

transferring said active matrix circuit from said quartz substrate to a first substrate comprising a resin to provide said active matrix circuit over said first substrate; and forming a layer comprising a liquid crystal in a gap to be formed between said first substrate and a second substrate with said active matrix circuit between said first substrate and said second substrate, wherein said quartz substrate is removed to be separated from said active matrix circuit in said transferring, and wherein said second substrate is a resin substrate.

34. A method according to claim 33 wherein said resin of said first substrate comprises a polyethylene terephthalate.

35. A method according to claim 33 wherein said resin of said second substrate comprises a polyethylene terephthalate.

36. A method of manufacturing a semiconductor device comprising:

forming an active matrix circuit over a glass substrate;

transferring said active matrix circuit from said glass substrate to a first substrate comprising a resin to provide said active matrix circuit over said first substrate; and forming a layer comprising a liquid crystal in a gap to be formed between said first substrate and a second substrate with said active matrix circuit between said first substrate and said second substrate, wherein said glass substrate is removed to be separated from said active matrix circuit in said transferring, and wherein said second substrate is a resin substrate.

37. A method according to claim 36 wherein said resin of said first substrate comprises a polyethylene terephthalate.

38. A method according to claim 36 wherein said resin of said second substrate comprises a polyethylene terephthalate.

39. A method of manufacturing an EL display comprising:

forming a pixel thin film transistor and a pixel electrode and a drive circuit thin film transistor for driving said pixel thin film transistor over a first substrate;

transferring said pixel thin film transistor and said pixel electrode and said drive circuit thin film transistor together from said first substrate to a second substrate to provide said pixel thin film transistor and said pixel electrode and said drive circuit thin film transistor over said second substrate; and opposing a third substrate to said second substrate to form an EL display comprising said third substrate and said second substrate, wherein said first substrate is removed to be separated from said pixel thin film transistor and said pixel electrode and said drive circuit thin film transistor in said transferring, and wherein said third substrate is a resin substrate.

40. A method of manufacturing an EL display comprising:

forming a pixel thin film transistor and a pixel electrode and a drive circuit thin film transistor for driving said pixel thin film transistor over a first substrate;

transferring said pixel thin film transistor and said pixel electrode and said drive circuit thin film transistor together from said first substrate to a second substrate comprising a resin to provide said pixel thin film transistor and said pixel electrode and said drive circuit thin film transistor over said second substrate; and opposing a third substrate to said second substrate to form an EL display comprising said third substrate and said second substrate, wherein said first substrate is removed to be separated from said pixel thin film transistor and said pixel electrode and said drive circuit thin film transistor in said transferring, and wherein said third substrate is a resin substrate.

41. A method of manufacturing an EL display comprising:

forming a pixel thin film transistor and a pixel electrode and a drive circuit thin film transistor over a first substrate comprising a quartz;

transferring said pixel thin film transistor and said pixel electrode and said drive circuit thin film transistor together from said first substrate to a second substrate comprising a resin to provide said pixel thin film transistor and said pixel electrode and said drive circuit thin film transistor over said second substrate; and opposing a third substrate to said second substrate to form an EL display comprising said third substrate and said second substrate, wherein said first substrate is removed to be separated from said pixel thin film transistor and said pixel electrode and said drive circuit thin film transistor in said transferring, and wherein said third substrate is a resin substrate.

42. A method of manufacturing an EL display comprising:

forming a pixel thin film transistor and a pixel electrode and a drive circuit thin film transistor over a first substrate comprising a glass;

transferring said pixel thin film transistor and said pixel electrode and said drive circuit thin film transistor together from said first substrate to a second substrate comprising a resin to provide said pixel thin film transistor and said pixel electrode and said drive circuit thin film transistor over said second substrate; and opposing a third substrate to said second substrate to form an EL display comprising said third substrate and said second substrate, wherein said first substrate is removed to be separated from said pixel thin film transistor and said pixel electrode and said drive circuit thin film transistor in said transferring, and wherein said third substrate is a resin substrate.

43. A method of manufacturing an EL display comprising:

forming a plurality of thin film transistors and a plurality of pixel electrodes over a glass substrate; and transferring said plurality of thin film transistors and said plurality of pixel electrodes together from said glass substrate to a first substrate comprising a resin to provide said plurality of thin film transistors and said plurality of pixel electrodes over said first substrate comprising a resin; and opposing a second substrate to said first substrate to form an EL display comprising said second substrate and said first substrate, wherein said glass substrate is removed to be separated from said plurality of thin film transistors and said plurality of pixel electrodes in said transferring, and wherein said second substrate is a resin substrate.

44. A method of manufacturing an EL display comprising:

forming an active matrix circuit comprising a pixel electrode over a quartz substrate; and transferring said active matrix circuit from said quartz substrate to a first substrate comprising a resin to provide said active matrix circuit over said first substrate comprising a resin; and opposing a second substrate to said first substrate to form an EL display comprising said second substrate and said first substrate, wherein said quartz substrate is removed to be separated from said active matrix circuit in said transferring, and wherein said second substrate is a resin substrate.

45. A method of manufacturing an EL display comprising:

forming an active matrix circuit comprising a pixel electrode over a glass substrate; and transferring said active matrix circuit from said glass substrate to a first substrate comprising a resin to provide said active matrix circuit over said first substrate comprising a resin; and opposing a second substrate to said first substrate to form an EL display comprising said second substrate and said first substrate, wherein said glass substrate is removed to be separated from said active matrix circuit in said transferring, and wherein said second substrate is a resin substrate.

46. A method of manufacturing an EL display comprising:

forming a plurality of pixel electrodes over a quartz substrate; and transferring said plurality of pixel electrodes together from said quartz substrate to a first substrate comprising a resin to provide said plurality of pixel electrodes over said first substrate; and opposing a second substrate to said first substrate to form an EL display comprising said second substrate and said first substrate, wherein said quartz substrate is removed to be separated from said plurality of pixel electrodes in said transferring, and wherein said second substrate is a resin substrate.

47. A method of manufacturing an EL display comprising:

forming a plurality of pixel electrodes over a glass substrate; and transferring said plurality of pixel electrodes together from said glass substrate to a first substrate comprising a resin to provide said plurality of pixel electrodes over said first substrate; and opposing a second substrate to said first substrate to form an EL display comprising said second substrate and said first substrate, wherein said glass substrate is removed to be separated from said plurality of pixel electrodes in said transferring, and wherein said second substrate is a resin substrate.

48. A method of manufacturing an EL display comprising:

forming an active matrix circuit over a quartz substrate; and transferring said active matrix circuit from said quartz substrate to a first substrate comprising a resin to provide said active matrix circuit over said first substrate; and opposing a second substrate to said first substrate to form an EL display comprising said second substrate and said first substrate, wherein said quartz substrate is removed to be separated from said active matrix circuit in said transferring, and wherein said second substrate is a resin substrate.

49. A method of manufacturing an EL display comprising:

forming an active matrix circuit over a glass substrate; and transferring said active matrix circuit from said glass substrate to a first substrate comprising a resin to provide said active matrix circuit over said first substrate; and opposing a second substrate to said first substrate to form an EL display comprising said second substrate and said fist substrate, wherein said glass substrate is removed to be separated from said active matrix circuit in said transferring, and wherein said second substrate is a resin substrate.

* * * * *